(12) United States Patent
Kobayashi

(10) Patent No.: US 6,317,377 B1
(45) Date of Patent: Nov. 13, 2001

(54) SEMICONDUCTOR MEMORY DEVICE

(75) Inventor: Shotaro Kobayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/546,915

(22) Filed: Apr. 11, 2000

(30) Foreign Application Priority Data

Apr. 12, 1999 (JP) .................................................. 11-104623

(51) Int. Cl.⁷ .................................................. G11C 7/00
(52) U.S. Cl. .............................. 365/220; 365/51; 365/63
(58) Field of Search ............................ 365/51, 205, 231, 365/63, 220

(56) References Cited

U.S. PATENT DOCUMENTS 5,467,319 * 11/1995 Nusinov et al. ..................... 365/231

* cited by examiner

Primary Examiner—Terrell W. Fears
(74) Attorney, Agent, or Firm—McGinn & Gibb, PLLC

(57) ABSTRACT

The purpose of the present invention is to provide a semiconductor memory device which is capable of suppressing an increase in chip surface area and in power consumption resulting from peripheral circuitry even when the capacity thereof becomes large, and which, moreover, does not experience discrepancies in clock skew and the like between I/Os, and which is capable of high speed operation. 4-bit parallel data comprising a 0th through 3rd bit are exchanged simultaneously between memory cell arrays with respect to each I/O pin in DQ0–DQ7. Data of the 0th bit through 3rd bit are inputted and outputted with the exterior in that order via input/output interface circuit 5-1. At data load signal LOAD, flip flop groups 12-0 through 12-3 incorporate the 0th through 3rd bit data corresponding to 8 I/O pins. It is necessary to initially read out the 0th bit parallel data to the exterior, so that flip flop group 12-0 is disposed in closest proximity to the input/output interface circuit 5-1. The 8 bits are shifted together from flip flop group 12-3 to flip flop group 12-0 synchronously with clock signal CLOCK, and the 0th through 3rd bit data are outputted.

9 Claims, 14 Drawing Sheets

[D-FF]

[D-Latch]

[Write Amp with enable]

SEMICONDUCTOR MEMORY DEVICE

BACKGROUND OF THE INVENTION

1. Field of the Invention

The present invention relates to a semiconductor memory device, and in particular, relates to a semiconductor memory device which is capable of exchanging data in a serial fashion between the device and the exterior while internally exchanging data with memory cells in a parallel manner, in order to realize high speed operations.

This application is based on Japanese patent application No. Hei 11-104623, the content of which is incorporated herein by reference.

2. Description of Related Art

In recent years, in concert with the dramatic advances in the performance of memory devices which have a large capacity and which are moreover capable of high speed operation. Examples of semiconductor memory devices having satisfactorily large capacity include, for example, DRAM (dynamic random access memory). DRAM conducts reading and writing of data by charging and discharging capacities within memory cells, so that it is impossible to force the operations within DRAM to follow at the speeds of system buses or microprocessors, which operate in accordance with high speed clock signals of a few hundred MHz or more. For this reason, structures have recently come to be adopted for DRAM in which the entirety of a memory cell array is divided into a plurality of banks which are mutually independent memory units, and access is conducted in order to differing banks while operating these banks in parallel. By doing this, it is possible to lower the internal DRAM data writing with respect to the external data writing while maintaining, from the point of view of the exterior of the DRAM, the appearance of data writing which matches the operational speed of the microprocessor.

In addition, strategies have been applied to lower the data writing within the DRAM with respect to the external data writing by sending and receiving data in a serial manner when data is exchanged between the DRAM and the exterior, while conducting data reading and writing among memory cell arrays within the DRAM in a parallel manner. The reason for this is that when data are selected within the memory cell arrays, it becomes difficult to conduct the adjustment of the timing between bits. For this reason, when data readout is conducted from a DRAM, parallel data comprising a plurality of bits are simultaneously read out from the memory cell arrays, these are converted to serial data, and are sequentially outputted to the exterior.

For example, by exchanging the 8-bit parallel data used internally with the exterior of the DRAM one bit at a time in a serial fashion, it is possible to reduce the data writing within the DRAM to ⅛ that in the exterior of the DRAM. Accordingly, in a DRAM with such a structure, a serial to parallel converter circuit and a parallel to serial converter circuit, are provided in order to interconvert the serial data which are exchanged with the exterior and the parallel data which are internally processed. Hereinbelow, the serial to parallel conversion will referred to as the serial-parallel conversion, and the parallel to serial conversion will be referred to as the parallel-serial conversion.

The structure of a semiconductor memory circuit such as that described above is shown in the block diagram of FIG. 13. In order to facilitate the explanation, this diagram shows, in an overlapping fashion, the structure of a semiconductor memory device containing four memory cell arrays 1-1 through 1-4, which has a 128 megabit capacity, and the structure of a semiconductor memory device containing eight memory cell arrays 1-1 through 1-8, which has a capacity of 256 megabits. Accordingly, the memory cell arrays 1-5 through 1-8 and the serial-parallel/parallel-serial conversion circuits 3-5 through 3-8 (described hereinafter) are not present in the 128 megabit semiconductor memory device. The structure of the 128 megabit device is that which is conventionally employed, and the structure of the 256 megabit device simply represents an increase in capacity over that of the 128 megabit device.

In the figure, interface logic 2 includes, in addition to an input/output (I/O) interface circuit which serves to conduct data transfer between the semiconductor memory devices depicted in the figure and the exterior, a booster circuit which is provided with common DRAM, a fuse for redundancy, a substrate generating circuit, and the like. Furthermore, serial-parallel/parallel-serial conversion circuits 3-1 through 3-8, which have the same structure, are provided between each memory cell array 1-1 through 1-8 and interface logic 2, respectively, as circuits which correspond to the serial-parallel conversion circuit and the parallel-serial conversion circuit described above. For example the serial-parallel/parallel-serial conversion circuit 3-1 conducts readout and writing using parallel data with respect to the corresponding memory cell array 1-1, and conducts the exchange of serial data with the exterior via interface logic 2.

That is to say, serial-parallel/parallel-serial conversion circuit 3-1 has the function of converting parallel data successively read out from memory cell array 1-1 to serial data and outputting these to interface logic 2, and has the function of converting serial data supplied from interface logic 2 to parallel data and writing these simultaneously into memory cell array 1-1. Examples of semiconductor memory devices which are provided with such serial-parallel/parallel-serial conversion circuits include, for example, cache memories and field memories, which are memories for image processing which have a FIFO (first in first out) function, as well as video RAM which stores the data of displayed images.

Here, FIG. 14 shows the connection relationships between the serial-parallel/parallel-serial conversion circuits 3-5 and 3-1 depicted in FIG. 13 and the input and output interface circuit 5-1 which is within the interface logic 2 depicted in Figure 13. Here, the depiction centers on the data flow, and the concrete structure of the serial-parallel/parallel-serial conversion circuits is not depicted. In the Figure, the DQ0 serial through DQ7 serial are groups of 8 bit data which are inputted and outputted simultaneously between the semiconductor memory device and the exterior via the input and output interface circuit 5-1. As will be shown hereinafter in the embodiments of the present invention, the writing and reading of the DQ0 serial through DQ7 serial depicted in FIG. 14 are separate; however, so as to avoid complexity, the reading and writing functions are depicted together in a single signal line.

Furthermore, the DQ0 parallel through DQ3 parallel are eight-bit four-group data which are simultaneously inputted and outputted with the memory cell array 1-5 depicted in FIG. 13. In the same way, the DQ4 parallel through DQ7 parallel are eight-bit four-group data which are simultaneously inputted and outputted with the memory cell array 1-1 depicted in FIG. 13. Next, references 4-0 through 4-7 indicate shift registers which conduct the shift operation in a synchronous manner with the clock signal CLOCK; these all have the same structure. Furthermore, the data load signal LOAD serves to indicate the timing for the loading of data into these shift registers. The clock signal CLOCK and the data load signal LOAD are supplied to the shift registers described above at each stage; however, so as to avoid complexity, these connection relationships are not depicted. In FIG. 14, the DQ0 serial through DQ7 serial are depicted in such a way as to be connected to the bit 0 of the corresponding shift register; this indicates only that in the case of reading or writing with respect to the memory cell array, the 0th bit is initially processed, so that either the data of bit 0 are initially outputted from each shift register, or the data of bit 0 are initially applied to each register.

Shift registers 4-0 through 4-7 are disposed for each I/O pad (DQ0–DQ7). When readout is to be conducted from the memory cell array, each shift register loads 8-bit parallel data at the point in time at which the data load signal LOAD becomes effective, and after this, conduct shifting of the parallel data one bit at a time in a manner synchronous with the clock signal CLOCK, so that the 8-bit serial data is sent to input/output interface circuit 5-1 from bit 0 through bit 7. On the other hand, when writing is to be conducted with respect to the memory cell array, the serial data are supplied in order from bit 0 to bit 7 from the input/output interface circuit 5-1 to each shift register, so that each shift register incorporates the serial data inputted in a synchronous manner with clock signal CLOCK, and ultimately outputs 8-bit parallel data. Furthermore, input/output interface circuit 5-1 is the part within the semiconductor memory device which is required for the highest speed operation; it controls the exchange of serial data between each shift register and the exterior.

As described above, in conventional semiconductor memory devices, the serial-parallel/parallel-serial conversion circuits are disposed so as to enclose the interface logic 2 (FIG. 13), and a number of serial-parallel/parallel-serial conversion circuits is required which corresponds to the number of memory cell arrays. Accordingly, when an increase in capacity is made from the 128-megabit DRAM indicated by the dashed line in FIG. 13 to a 256 -megabit DRAM, the number of memory cell arrays goes from four to eight, and in proportion to this, the number of serial-parallel/parallel-serial conversion circuits also increases. As a result, the circuitry increases in area by that surface area which is taken up by the serial-parallel/parallel-serial conversion circuits, and the surface area of the chip as a whole becomes larger. Furthermore, the load capacity and the like of the clock used to operate the serial-parallel/parallel-serial circuits also increases, so that the power consumption also increases.

In addition to these problems, in the conventional serial-parallel/parallel-serial conversion circuit structure, there is an important drawback which has a direct effect on the access time of the semiconductor memory device. This point will be explained with reference to FIG. 15. FIG. 15 shows the connection relationships between the memory cell arrays and the input/output pads in the semiconductor memory device depicted in FIG. 13 in greater detail; those structural elements which are identical to those depicted in FIGS. 13 and 14 are given identical reference numbers. As shown in the figure, the input/output interface circuit 5-1 depicted in FIG. 14, and an input/output interface circuit 5-2 having the same structure, are provided within interface logic 2, and these are both disposed in the vicinity of the center of the chip.

Included in the input/output interface circuit are I/O pads for eight pins, I/O buffers corresponding to each I/O pad, circuitry for selecting either data from the memory cell arrays in the upper half (for example, memory 1-5) or data from memory cell arrays in the lower half (for example, memory cell array 1-7), and the like. The DQ0–DQ7 shown in input/output interface circuit 5-1 indicate I/O pads corresponding to serial data DQ0–DQ7 shown in FIG. 14. Furthermore, focusing on the memory cell arrays which are in the half upward from the interface logic 2, DQ0–DQ3 and DQ4–DQ7 are connected, respectively, to memory cell arrays 1-5 and 1-1 as described above, and furthermore, the DQ8–DQ11 and DQ12–DQ15 I/O pads are connected, respectively, to memory cell arrays 1-2 and 1-6. The memory cell arrays which are in the half below the interface logic 2 are identical.

Here, if one assumes that the semiconductor memory device has the structure of the 128 megabit structure shown by the dashed line in FIG. 13, no particular problems are present. In such a case, there are no serial-parallel/parallel-serial conversion circuits corresponding to memory cell arrays 1-5 through 1-8, and for example, serial-parallel/parallel-serial conversion circuit 3-1 is connected closely to the I/O pads (DQ0–DQ7) within input/output interface circuit 5-1. For this reason, even if the I/O pads are different, the length of the wiring between the serial-parallel/parallel-serial conversion circuits and the input/output interface circuits does not differ dramatically, so that there is not so much undesirable variation caused in the response time between these I/O pads.

However, when the capacity of the semiconductor memory device is expanded so as to achieve a structure of, for example, 256 megabits, the problems begin to become pronounced. In other words, whereas the I/O pads DQ4–DQ5 and the like were in close proximity to the serial-parallel/parallel-serial conversion circuit 3-1, so that wiring delays were small, the I/O pads DQ0–DQ3 and DQ6–DQ7 are distant from the serial-parallel/parallel-serial conversion circuit 3-5, so that the wiring delay becomes larger than that in the case of DQ4 and DQ5 by this amount. In this way, when the distance from the serial-parallel/parallel-serial conversion circuit to the I/O pad differs for each I/O pin, then the timing of the data, which should be simultaneously inputted and outputted, becomes disordered, and this becomes a great obstacle in increasing the speed of the semiconductor memory device.

As described above, when the number of memory cell arrays are increased in order to increase the capacity, the chip extends of necessity in the longitudinal direction of the interface logic 2 shown in FIG. 13, and the problems described above occur. These problems occur because the I/O pads are disposed in the vicinity of the center of the chip, and it might be thought that by moving the I/O pads to positions in the vicinity of the memory cell arrays in concert with an increase in capacity so that, for example, the I/O pads of DQ0–DQ7 shown in FIG. 15 might be disposed equidistant from the memory cell arrays 1-5 and 1-1, the problem would be solved. However, the most recent packages are CSPs (chip size packages) having a size which takes into account the size of the chip. For this reason, for the reasons described above, irrespective of whether the number of I/O pads has not been changed, the disposition of the I/O pads cannot be easily changed.

FIG. 16 shows the bottom surface of a BGA (ball grid array) which is a type of CSP; this actually realizes a conventional semiconductor memory device which is provided with four memory cell arrays. Ball bumps are disposed in the form of a matrix in the package in BGA, and I/O pads are arranged in a concentrated manner in the vicinity of the center of the package. In other words, in the figure, the parts surrounded by circles (○) are ball bumps, and the rectangles (□) which are smaller than the ball bumps are the pads. From left to right in the figure, "DQA7–DQA0, DQB0–DQB7" is written in the pads and in the circles (○) of the ball bumps corresponding thereto, and these correspond to the DQ0–DQ7 and DQ8–DQ 15 shown in FIG. 15. Even if the memory capacity is doubled and the number of memory cell arrays becomes eight, the position of the pads and balls will not change from that shown in FIG. 16; however, because the chip size will not be the same, the shape will be one in which the left and right edges in the figure are further extended in the left and right directions.

At this time, one reason for fixing the positions of the balls is that if the balls are moved in accordance with chip size, the wiring to the read frames becomes difficult. Accordingly, the position of the balls is of necessity fixed in the central portion of the chip. Another reason is that if the disposition of the balls is greatly changed when the memory capacity is increased, it becomes impossible to commonly employ the printed substrate on which design is conducted using the conventional ball arrangement as a model, and this will cause a problem in that it will be necessary to completely redesign the print substrate from the beginning. For these reasons, it is necessary to establish a ball arrangement which will, as much as possible, maintain the characteristics of the previous generation even after a new generation of semiconductor memory devices is developed, and this also matches the needs of the market.

Additionally, the following problems are also present in the conventional semiconductor memory device structure. As shown in FIG. 14, if shift registers 4-0 through 4-7 are arranged so as to correspond with the I/O pads (DQ0–DQ7), then the wiring which supplies the data load signal LOAD extends from the right side to the left side in the figure, and when the data load signal LOAD is distributed to shift registers 4-0 through 4-7, a transmission skew is produced. For this reason, the operational frequencies of the semiconductor memory device are limited. Furthermore, when the clock signal is wired in the same manner as the data load signal LOAD and distributed to each shift register, then an undesirable variation in the clock phase is produced between shift registers, and this has an effect on access.

In FIG. 14, clock signal CLOCK is caused to move in the left and right direction from the vicinity of the center of serial-parallel/parallel-serial conversion circuits 3-5 and 3-1 and is distributed to each shift register. When this is done, it is possible to make the apparent length half that in the case of wiring similar to that of data load signal LOAD; however, the fact that the clock is not transmitted to each shift register at the same time remains unchanged. Accordingly, a I/O skew is also produced in this case, and the operating margin is reduced, and this results in a limitation of the operational frequencies of the semiconductor memory device itself.

Furthermore, if the wiring shown in FIG. 14 is employed, a discrepancy is produced between the clock signal skew and the data load signal skew and this results in a disruption of high speed operations. Consideration could also be given to restricting the data load signal in the same manner as the clock signal; however, there is a limitation in wiring space and the like, and in practice it would be very difficult to restrict all the signals in the same way as the clock signal in the figure. As described above, it is important to restrict the wiring of the clock signal or the load signal and it is an objective to make the skew in these signals between I/Os as small as possible in order to realize high speed operations.

BRIEF SUMMARY OF THE INVENTION

The present invention was created in light of the above circumstances; it has as an object thereof to provide a semiconductor memory device which, even while having a large capacity, suppresses the increase in chip surface area and in power consumption resulting from the peripheral circuitry such as the serial-parallel/parallel-serial conversion circuits and the like, and in which, moreover, there is no I/O variation in the skew of the clock signals and like, so that the setting of the timing is a simple matter, and high speed operation is possible.

As described above, a first aspect of the present invention is a semiconductor memory device which is provided with a conversion mechanism for conducting conversion between parallel data which are transferred simultaneously between memory cell arrays, and serial data, which are exchanged with the exterior via input/output pads; wherein the conversion mechanism is provided with a plurality of storage mechanisms which are common between adjacent memory cell arrays and which store data comprising the parallel data, and among the plurality of storage mechanisms, a storage mechanism which stores, among the data comprising parallel data, data which are initially outputted to the exterior, is positioned in closest proximity to the input/output pads.

As explained above, according to the first aspect of the present invention, the conversion mechanism for conducting a conversion between the parallel data exchanged with the memory cell arrays and the serial data exchanged with the exterior may be employed in common by adjacent memory cell arrays. For this reason, it is possible to reduce the number of such conversion mechanisms by half in comparison with the conventional technology, and it is possible to reduce the number of elements and the chip surface area by this amount, and is also possible to reduce the power consumed by the amount employed by the eliminated conversion mechanisms.

Furthermore, according to the first aspect of the present invention, among the plurality of storage mechanisms for storing the data comprising the parallel data, the storage mechanism which stores the data which are initially outputted to the exterior of the semiconductor memory device is disposed in closest proximity to the input/output pads. For this reason, it is possible to output the most critical data with the smallest possible delay, and thus to realize an increase in functionality as a result of reduction in access time.

DETAILED DESCRIPTION OF THE INVENTION

Figure 1:
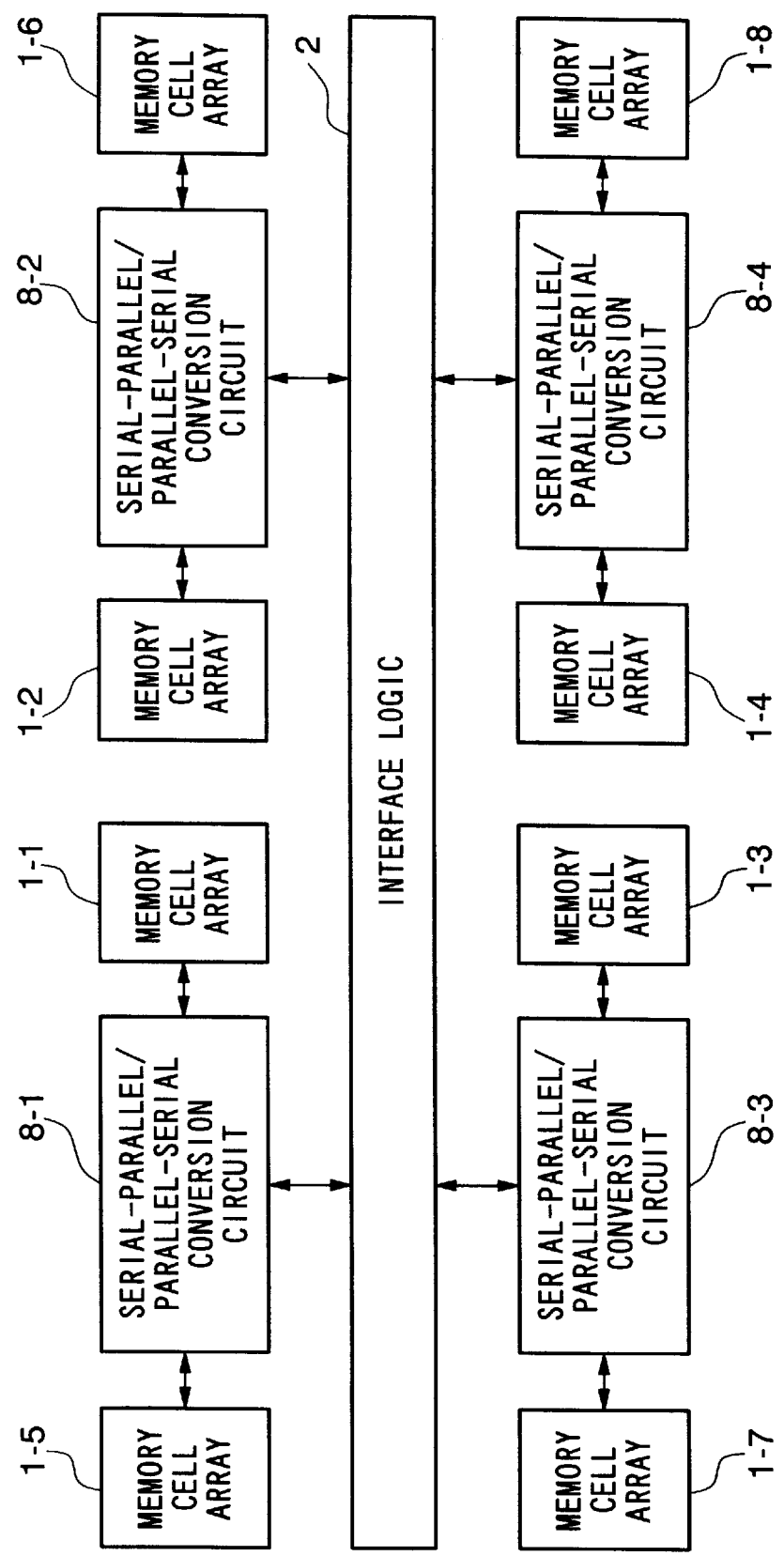
FIG. 1 is a block diagram showing the outlines of the structure of a semiconductor memory device in accordance with each embodiment of the present invention.

A second aspect of the present invention is a semiconductor memory device in accordance with the above first aspect of the present invention, wherein, among the plurality of storage mechanisms, storage mechanisms for storing, among the data comprising the parallel data, data simultaneously exchanged with the exterior are disposed together with respect to all the input/output pads.

According to the second aspect of the present invention, the storage mechanisms for storing data exchanged simultaneously with the exterior are disposed in a concentrated fashion with respect to all the input/output pads. By means of this, it is possible to make the wiring lengths between the conversion mechanism and each input/output pad more uniform among I/Os, and thus the difference in wiring delay among input/output pads can be eliminated. For this reason, it is possible to minimize the skew difference between I/Os, and it is thus possible to achieve an increase in the operational speed of the semiconductor memory device as a whole. Furthermore, when the chip size becomes large as a result in increase in capacity, the wiring length does not become disparate among I/Os even if the positions of the input/output pads are not changed, so that no disruptions in high speed operations are caused. Furthermore, even when new semiconductor memory device generations appear, the interchangeability of the arrangement of the input and output terminals is maintained, so that easy application to CSP such as BGA and the like is possible, and in addition, the print substrates and the like, which were designed in such a manner as to accommodate the conventional input/output terminal disposition, may continue to be employed, so that there will be no waste involved in the redesign of the print substrate.

A third aspect of the present invention is a semiconductor memory device in accordance with the above first or second aspects of the present invention, wherein a control signal for controlling conversion operations by the conversion mechanism is supplied from the side of a storage mechanism disposed in closest proximity to the input/output pads in the arrangement of the plurality of storage mechanisms.

According to the third aspect of the present invention, control signals for the conversion operation, such as the clock signal or the data load signal, are supplied in such a manner as to travel from the side of the storage mechanism disposed in closest proximity to the input/output pads along the arrangement of the storage mechanism. For this reason, it is possible to put in order the timing at which the control signals are supplied to each part within the conversion mechanism among the control signals, so that the worsening of the margin resulting from the skew discrepancy among control signals can be eliminated. Furthermore, the plurality of control signals travel in a single direction, so that it is possible to easily conduct the wiring for these control signals, and the guiding of the wiring is also a simple matter.

A fourth aspect of the present invention is a semiconductor memory device in accordance with any one of the above first to third aspects of the present invention. wherein the conversion mechanism conducts conversion between the parallel data and the serial data by shifting data stored in the plurality of storage mechanisms in accordance with a clock signal having a predetermined frequency, and a direction in which the clock signal is supplied in order to the storage mechanisms is opposite to a direction in which data stored in the storage mechanisms are shifted.

According to the fourth aspect of the present invention, the conversion operation is realized by shifting the data stored by plurality of storage mechanisms in accordance with a clock signal, and at this time, the direction in which the clock signal is successively supplied to each storage mechanism and the direction in which the data are shifted are opposite. For this reason, during the process of shifting the stored data, after each stage has incorporated the data of the previous stage, the data of the previous stage change, and there is thus excess present in the margin of the setup time and the hold time of the data, and the design of the timing is simplified.

A fifth aspect of the present invention is a semiconductor memory device in accordance with any one of the above first to fourth aspects of the present invention, wherein the conversion mechanism is provided with a selecting mechanism for selecting memory cell arrays which conduct exchange of the parallel data, among the adjacent memory cell arrays, and among the adjacent memory cell arrays, only that memory cell array selected by the selecting mechanism is activated.

According to the fifth aspect of the present invention, among the neighboring memory cell arrays, one or the other of the memory cell arrays is selected which conducts the exchange of parallel data, and only this memory cell array is activated. For this reason, in comparison with a structure in which all of the adjacent memory cell arrays are activated, it is possible to reduce the power consumption.

A sixth aspect of the present invention is a semiconductor memory device in accordance with any one of the above first to fifth aspects of the present invention, wherein the plurality of storage mechanisms comprise shift registers.

A seventh aspect of the present invention is a semiconductor memory device in accordance with any one of the above first to sixth aspects of the present invention, wherein the plurality of storage mechanisms comprise a first shift mechanism, which shifts the parallel data read out from the memory arrays and output the serial data in succession, and a second shift mechanism, which conducts shifting while successively incorporating the serial data supplied through the input/output pads and converts these to the parallel data; and the first shift mechanism and the second shift mechanism are disposed so that a shift direction of the first shift mechanism and a shift direction of the second shift mechanism are identical.

A eighth aspect of the present invention is a semiconductor memory device in accordance with the above seventh aspect of the present invention, wherein the first shift mechanism and the second shift mechanism comprise identical shift registers, and the conversion operation from the parallel data to the serial data, and the conversion operation from the serial data to the parallel data, are conducted in a time-divided fashion.

According to the eighth aspect of the present invention, the same shift registers are employed for the conversion operation from parallel data to serial data and for the conversion operation from serial data to parallel data, and these operations are conducted in a time divided manner. For this reason, in comparison with the case in which the former conversion operation and the latter conversion operation are conducted by different shift registers, the scale of the circuitry can be reduced, and the chip surface area can also be minimized, and there is a savings in the power consumption.

A ninth aspect of the present invention is a semiconductor memory device, wherein the input/output pads are disposed in such a manner as to be gathered at the central portion of a package, in which semiconductor memory devices in accordance with any one of the above first to eighth aspects of the present invention are sealed.

Embodiments

Hereinbelow, embodiments of the present invention will be explained in detail with reference to the figures.

First Embodiment

Figure 13:
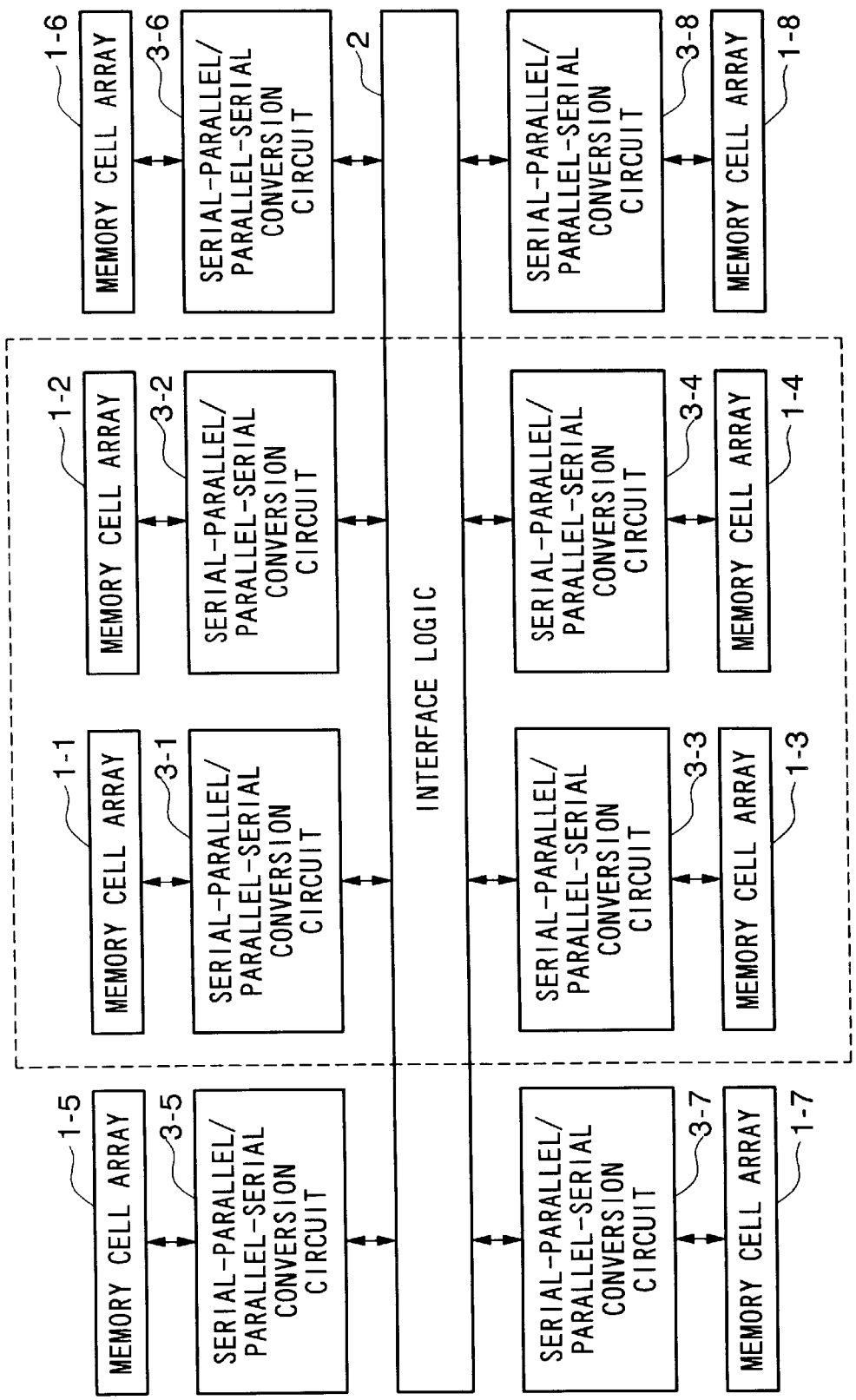
FIG. 13 is a block diagram showing the outlines of the structure of a semiconductor memory device in accordance with conventional technology.

FIG. 1 is a block diagram showing the outlines of the structure of a semiconductor memory device in accordance with the present embodiment; the structural elements which are depicted in FIG. 13 are given identical reference numbers. As can be understood from the discussion of the conventional art. FIG. 1 is a structural example of a 256 megabit semiconductor memory device which is provided with 8 memory cell arrays. In the present embodiment, the structure is such that there is only one serial-parallel/parallel-serial conversion circuit for each two memory cell arrays, and each serial-parallel/parallel-serial conversion circuit is commonly used by the two memory cell arrays which are disposed on either side thereof. In other words, serial-parallel/parallel-serial conversion circuit 8-1 is commonly employed by memory cell arrays 1-1 and 1-5, and in the same way, serial-parallel/parallel-serial conversion circuit 8-2 is commonly employed by memory cell arrays 1-2 and 1-6. Serial-parallel/parallel-serial conversion circuit 8-3 is commonly employed by memory cell arrays 1-3 and 1-7 and serial-parallel/parallel-serial conversion circuit 8-4 is commonly employed by memory cell arrays 1-4 and 1-8.

Figure 14:
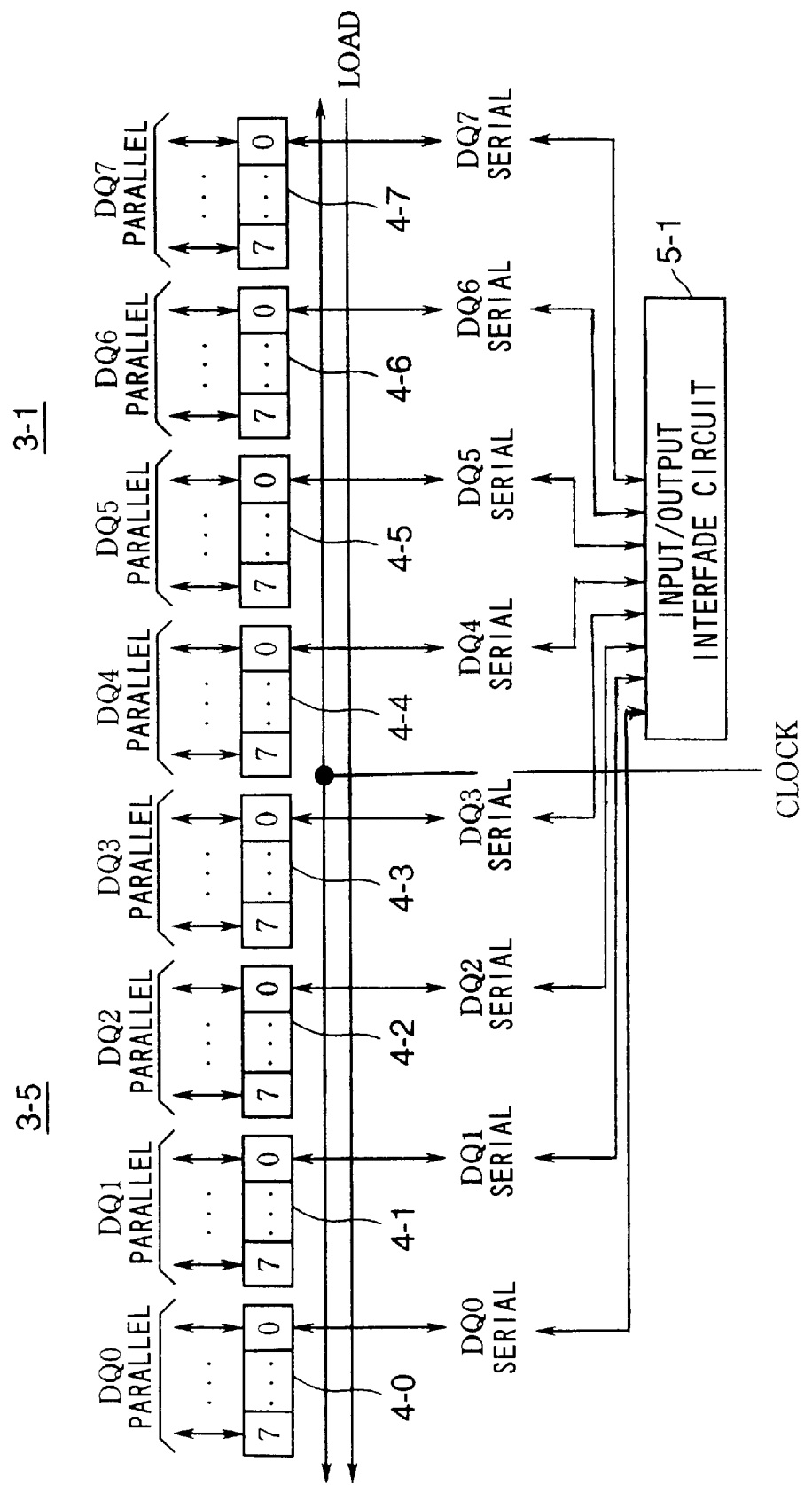
FIG. 14 is a block diagram showing the connection relationships between the serial-parallel/parallel-serial conversion circuit shown in FIG. 13 and input/output interface circuits provided within an interface logic.

Here, when the serial-parallel/parallel-serial conversion circuits are arranged as shown in FIG. 1, when the conventional structure shown in FIG. 14 is employed for the serial-parallel/parallel-serial conversion circuits, the following problems occur. If we assume that, for example, the entirety of the shift registers 4-0 through 4-7 shown in FIG. 14 are rotated by 90° in a counter-clockwise direction and disposed between memory cell arrays 1-1 and 1-5, then this will be the serial-parallel/parallel-serial conversion circuit commonly employed by both memory cell arrays. Additionally, in this case, input/output interface circuit 5-1 is disposed within interface logic 2, and the clock signal CLOCK and the data load signal LOAD are supplied from the interface logic 2, so that these signals are supplied from shift register 4-0 in the direction of shift register 4-7.

When this is done, the shift register 4-0 (in other words, DQ0) is closest to the interface logic 2, while shift register 4-7 (that is to say, DQ7) is farthest from interface logic 2. Accordingly, even though the data of the 0th bit is simultaneously outputted from each shift register as the DQ0 serial through DQ7 serial, the DQ0 serial data is transmitted fastest to the input/output interface circuit 5-1, and the DQ7 serial data is transmitted slowest. Moreover, there is a distance of 4–5 mm between the 7th bit of the DQ0 parallel and the 0th bit of the DQ7 parallel, so that the wiring delay cannot be ignored. For this reason, the timing at which the serial data is transmitted to the interface logic 2 varies for each I/O, and in the same manner as that of the conventional serial-parallel/parallel-serial conversion circuit, as a result of the skew produced between I/Os, there is a limitation on the operating frequencies.

Figure 2:
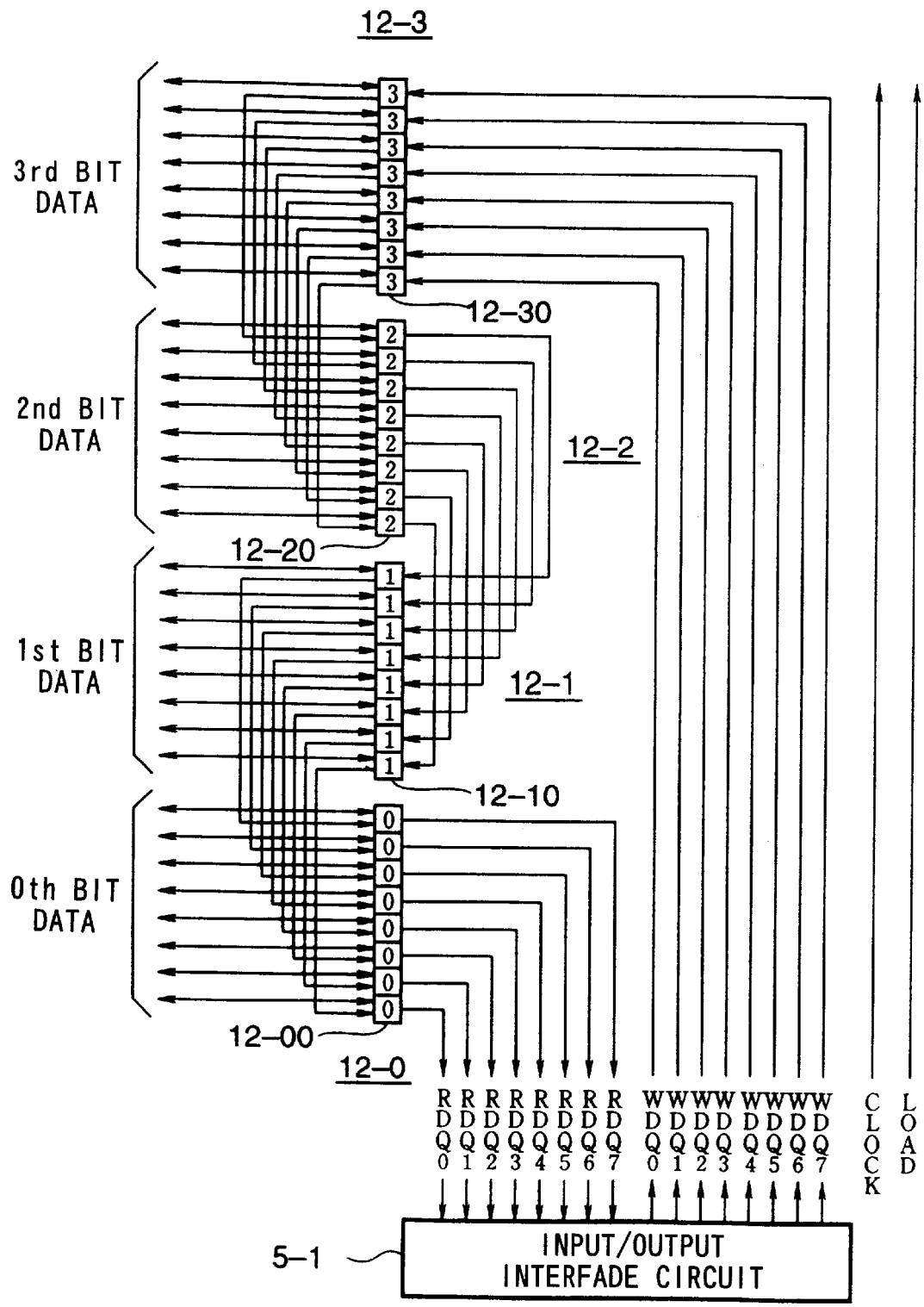
FIG. 2 is a block diagram showing the outlines of the structure of a serial-parallel/parallel-serial conversion circuit in accordance with each embodiment of the present invention.

For this reason, in the present embodiment, the problems described above are solved without adding changes to the electrical wiring itself by employing stratagems in the arrangement of the serial-parallel/parallel-serial conversion circuits and in the (guiding of the signal lines. As a result, it becomes possible to commonly use the serial-parallel/parallel-serial conversion circuits, which was not realized by the conventional structure, and this leads to an improvement in all characteristics, such as access time and the like. FIG. 2 shows the outlines of the structure of a serial-parallel/parallel-serial conversion circuit in accordance with the present embodiment; the structure shown as an example here corresponds to the serial-parallel/parallel-serial conversion circuit 8-1 depicted in FIG. 1. Furthermore, in FIG. 2, those signals which are identical to those depicted in FIG. 14 are given the same designations, and the depiction centers on the flow of data, as in FIG. 14. Furthermore, because the serial-parallel/parallel-serial conversion circuit is commonly employed by two memory cell arrays, the serial-parallel/parallel-serial conversion circuit 8-1 depicted exchanges data between the memory cell arrays 1-5 and 1-1 which are disposed on either side thereof; however in this drawing, only memory cell array 1-5 is depicted.

In FIG. 2, the "0th bit data"–"3rd bit data" are given numbers "0"–"3" in accordance with the order in which they are processed in a time series manner. That is to say, the readout from the memory cell array and the writing to the memory cell array are processed in such an order that the 0th data is first processed, and then, in order, the first data, the second data, and the third data are processed. Furthermore, as is clear from the figure, the "0th data", for example, constitutes 8-bit parallel data which is simultaneously exchanged between memory cell arrays.

Additionally, in the present embodiment, the arrangement is such that the data which are simultaneously exchanged from the serial-parallel/parallel-serial conversion circuit with respect to the input/output interface circuit 5-1 are compiled from those outputted initially in a time series manner and outputted. That is to say, the characteristic feature of this is that, among the 8-bit parallel data simultaneously exchanged with the memory cell array, the "0th bit" serial data (the "0th bit data" in the figure) which are initially exchanged with the exterior are positioned closest to the input/output interface circuit 5-1 (interface logic 2). This is to say that the access time in the case in which a readout request is conducted with respect to the semiconductor memory device is determined by how fast the "0th bit" data may be outputted, so that the serial-parallel/parallel-serial conversion circuit and the input/output interface circuit 5-1 are disposed in close proximity so as to output the "0th bit" data in the shortest possible time.

Additionally, in FIG. 2, references RDQ0–RDQ7 indicate parallel data which are simultaneously read out from the memory cell arrays 1-5 shown in FIG. 1; these correspond to the I/O pads of DQ0–DQ7. In the same way, the data WDQ0–WDQ7 are data which are simultaneously written into memory cell array 1-5, and these correspond to the I/O pads of DQ0–DQ7, respectively. Furthermore, FIG. 2 shows only the 0th through 3rd bit of the 8-bit parallel data simultaneously read out from the memory cell array. The 4th through 7th bit data are outputted from the side of memory cell array 1-7 to the interface logic 2 via serial-parallel/parallel-serial conversion circuit Next, flip flop groups (in the figures, shortened to "FF") 12-0 through 12-3 store the 0th bit data through 3rd bit data comprising 8 bits, respectively; these incorporate the output of the previous stage flip flop group in a synchronous manner with clock signal CLOCK, and in accordance with the data load signal LOAD, the 0th through 3rd bit data are simultaneously established with respect to these flip flop groups. In actuality, the clock signal CLOCK and the data load signal LOAD are supplied to the eight flip flops comprising the individual flip flop groups; however, in order to avoid complexity, a depiction of this wiring is omitted.

As was touched on above, the flip flop group 12-0 which stores the 0th bit data is disposed at a position which is closest to the input/output interface circuit 5-1, and the stored data of this flip flop group 12-0 are outputted to the input/output interface circuit 5-1 as data RDQ0–RDQ7. Furthermore, the flip flop groups 12-1 through 12-3 which store the first through third data in the processing sequence described above are arranged in order from positions closer to the input/output interface circuit 5-1 to positions farther away from the input/output interface circuit 5-1. Data WDQ0–WDQ7 are inputted into flip flop 12-3. Furthermore, the flip flop storing the data RDQ0 is disposed at a position in closest proximity to the input/output interface circuit 5-1, while the flip flops storing, respectively, the data RDQ1–RDQ7 are arranged in order from positions closer to the input/output interface circuit 5-1 to positions farther away from the input/output interface 5-1.

Furthermore, if attention is focused, for example, on the data RDQ0 and WDQ0 among the data RDQ0–RDQ7 and WDQ0–WDQ7, these data RDQ0 and WDQ0 are connected to one shift register which is connected in order to flip flops 12-00, 12-10, 12-20, and 12-30. The situation is the same with respect to data RDQ1–RDQ7 and WDQ1–WDQ7. Additionally, the 8-bit data stored in flip flop groups 12-0 through 12-1 are successively shifted from flip flop group 12-3 in the direction of flip flop group 12-0 by the supply of clock signal CLOCK.

Accordingly, in the case of readout from the memory cell arrays, first, data corresponding to 32 bits is simultaneously loaded into flip flop groups 12-0 through 12-3 in accordance with the data load signal LOAD, and after this, when the clock signal CLOCK is supplied, the 0th bit data, which must be initially outputted, is first outputted to input/output interface circuit 5-1 as data RDQ0–RDQ7. After this, a shift operation is conducted in a manner synchronous with the clock signal CLOCK, and the first bit data, the second bit data, and the third bit data are successively outputted from flip flop group 12-0 to input/output interface circuit 5-1.

On the other hand, when writing is to be conducted into the memory cell array, the 0th bit parallel data is first applied as data WDQ0–WDQ7 and the clock signal CLOCK is supplied, so that the data WDQ0–WDQ7 applied to flip flop group 12-3 are incorporated. Thereinafter, the first bit parallel data through third bit parallel data are successively applied together with the clock signal CLOCK, and each time, a shift operation is conducted from flip flop 12-3 in direction of flip flop 12-0, and the data applied to data WDQ0–WDQ7 are incorporated into flip flop group 12-3. Then, at the point in time at which all of the 32 bits of written data have been established in flip flop groups 12-0 through 12-3, these data are simultaneously written into a memory cell array which is not depicted.

Figure 3:
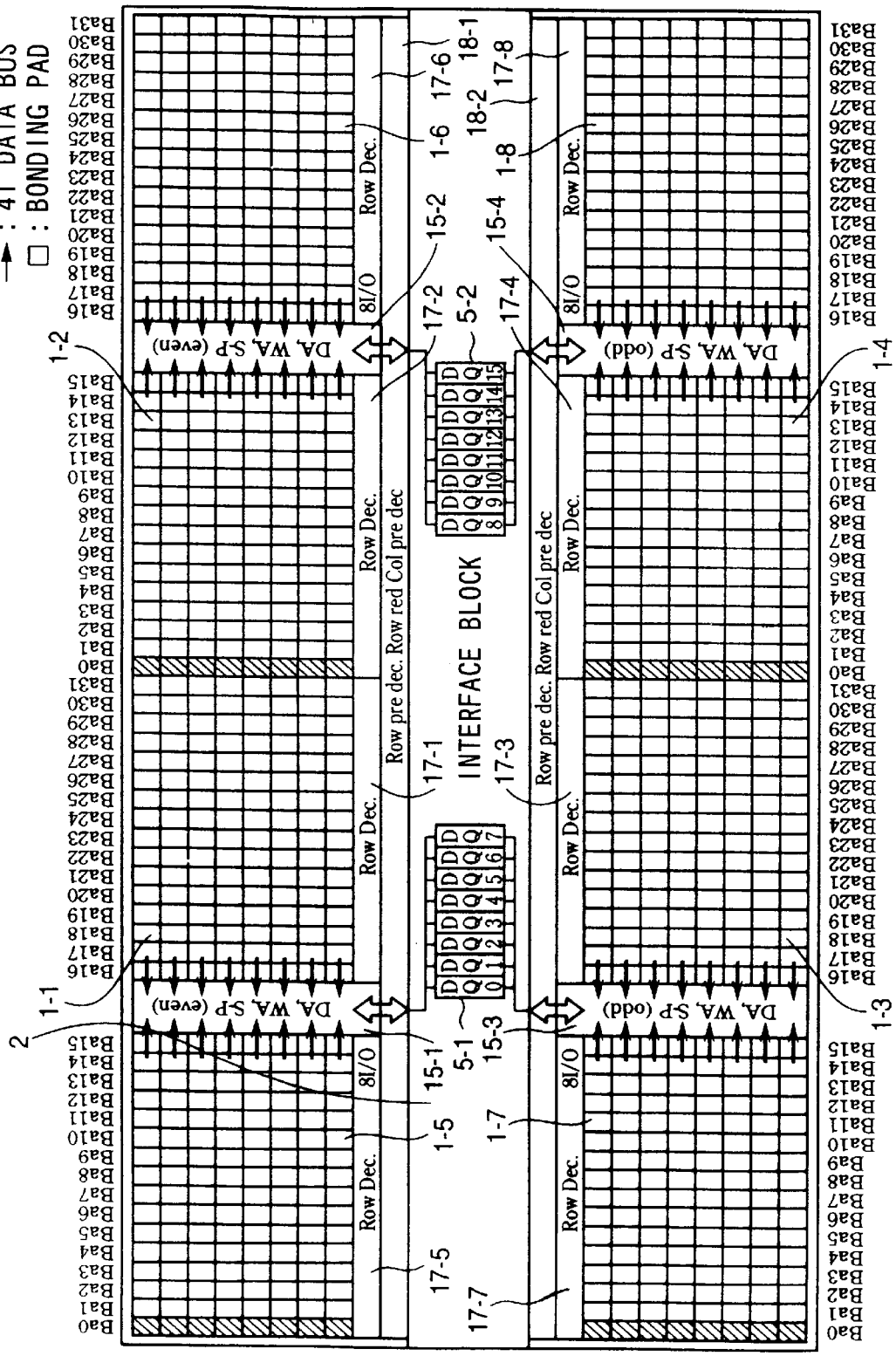
FIG. 3 is a block diagram showing the details of the structure of a semiconductor memory device in accordance with each embodiment of the present invention.

FIG. 3 shows the structure of the semiconductor memory device in accordance with the present embodiment in greater detail than does FIG. 1; those structural elements which are identical to those of FIG. 1 are given identical reference numbers. In the figure, banks Ba0–Ba31 are memory banks which serve to realize high speed operations; the 32 banks are assigned using, as units, two memory cell arrays which employ in common a serial-parallel/parallel-serial conversion circuit. Furthermore, circuit blocks 15-1 through 15-4 contain, in addition to the serial-parallel/parallel-serial conversion circuit ("S-P") described above, a data amplifier ("DA") for amplifying data read out from the memory cell array by a sense amplifier (not depicted in the figure), a writing amplifier (the "WA" in the figure) which is employed during the writing of the data into the memory cell array, and the like.

Figure 15:
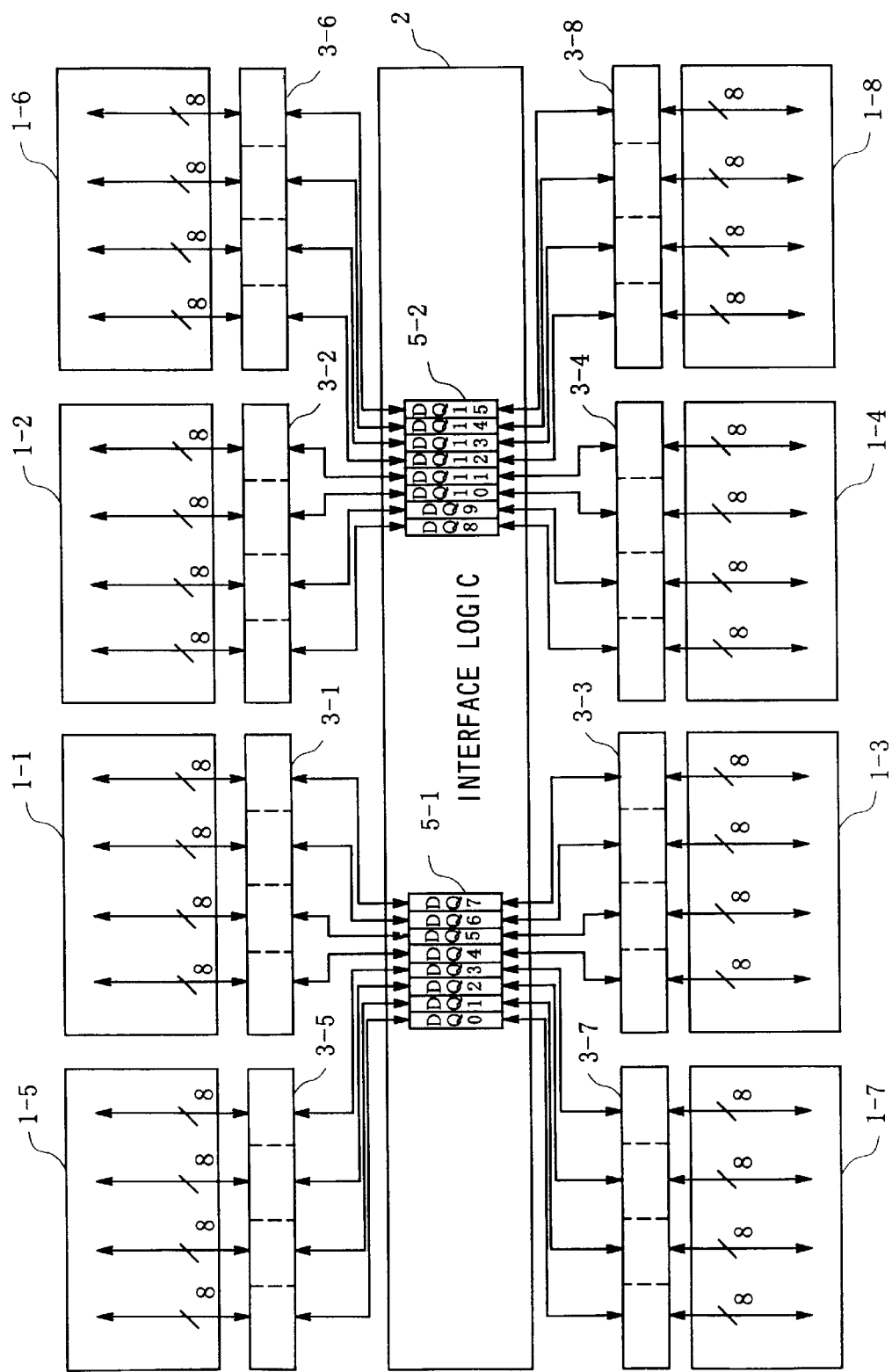
FIG. 15 is a block diagram showing the details of the connection relationships between the memory cell arrays and the I/O pads in the semiconductor memory device shown in FIG. 13.
Figure 16:
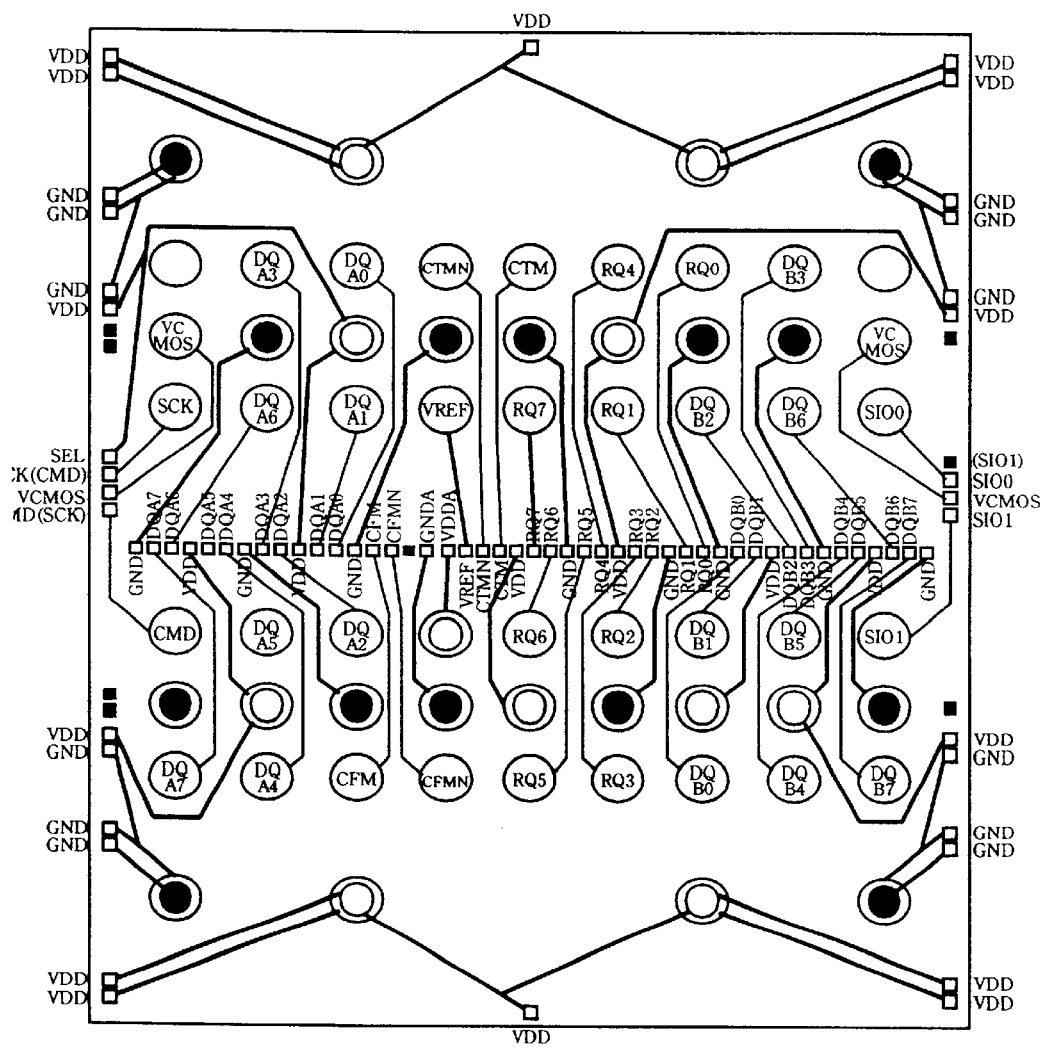
FIG. 16 is a bottom view of BGA, which is a type of CSP.

Furthermore, the 16 rectangles (○) are all bonding pads for data input and output, and these correspond to the DQ0–DQ15 shown in FIG. 15. Furthermore, references 17-1 through 17-8 are row decoders corresponding to the memory cell arrays 1-1 through 1-8, and row predecoders ("Row pre dec."), redundancy circuits ("Row red."), bank and column predecoders ("Col pre dec") and the like are provided in circuit blocks 18-1 through 18-2, and the column decoders which conduct the main decoding of the columns are in the region in which the sense amplifier described above is disposed.

Then, in FIG. 3, the serial-parallel/parallel-serial conversion circuit depicted in FIG. 2 is disposed, for example, within circuit block 15-1, and the wires RDQ0–7 shown in FIG. 2 are extended from the region of the circuit block 15-1 which is placed between the row decoder 17-5 and the row decoder 17-1 to the input/output interface circuit 5-1 (DQ0–DQ7 in the figure) which is disposed in the immediate vicinity. In this way, in comparison with the guiding of the wiring of DQ0–DQ7 shown in FIG. 15, the variation among I/Os in the length of the wiring between the serial-parallel/parallel-serial conversion circuit and the input/output interface circuit 5-1 is minimized.

Figure 4:
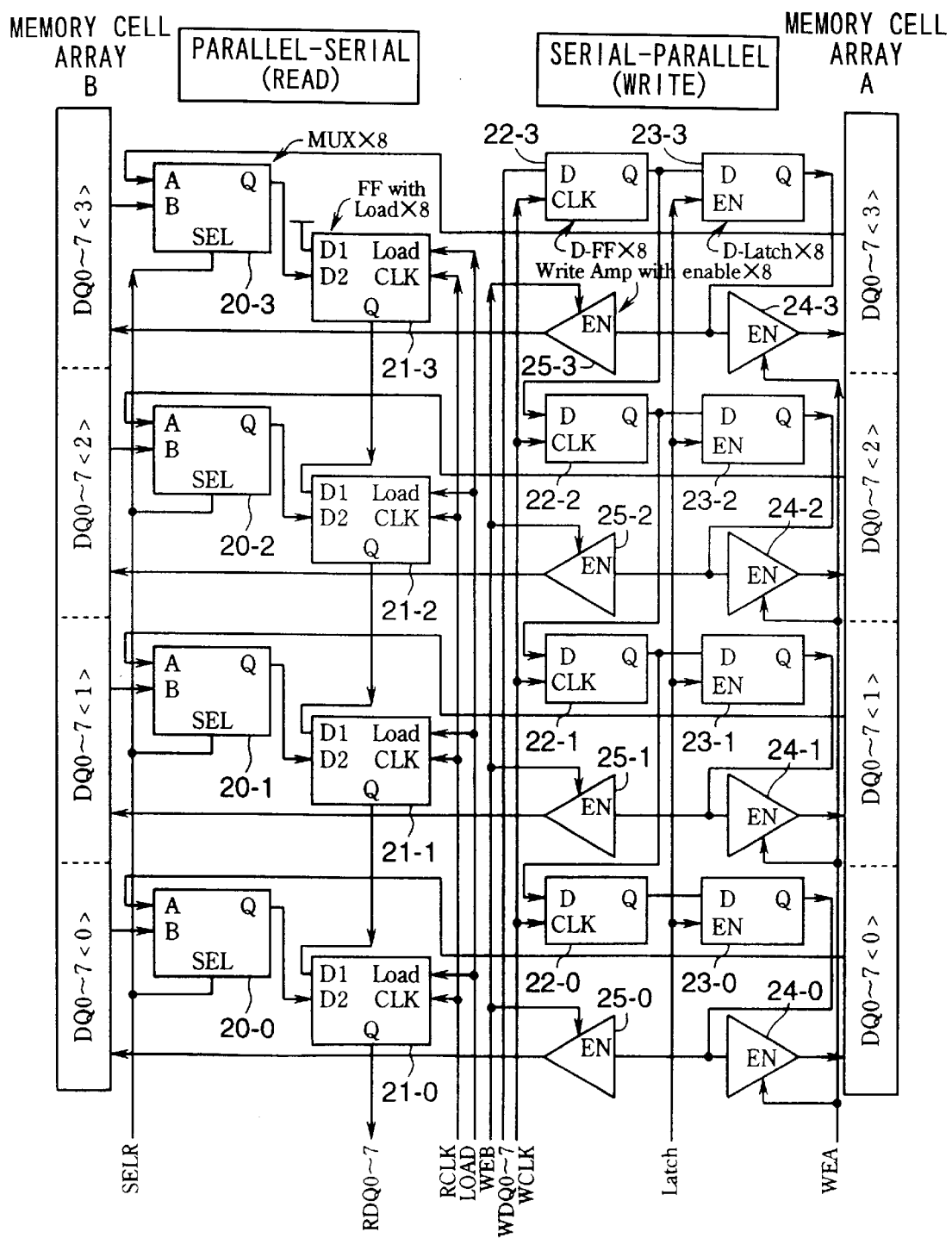
FIG. 4 is a block diagram showing the details of the structure of a serial-parallel/parallel-serial conversion circuit in accordance with a first embodiment of the present invention.

Next, FIG. 4 depicts the details of the structure of a serial-parallel/parallel-serial conversion circuit in accordance with the present embodiment; a structure is adopted in which the serial-parallel conversion circuit and the parallel-serial conversion circuit are mutually independent. It is also possible for the serial-parallel conversion circuit and the parallel-serial conversion circuit to employ a portion of the circuitry in common; such an embodiment will be explained in the second embodiment hereinbelow. In this figure, as in FIG. 2, the details of the connection relationships by bit between a flip flop group and another flip flop group are omitted; the 8-bit data which are simultaneously shifted between flip flop groups are shown in a collective fashion. Furthermore, the various signals depicted in the figure, such as SELR, RDQ0–7, RCLK, LOAD, WEB, WDQ0–7, WCLK, Latch, and WEA (the details of these will be given hereinbelow), are supplied from the interface logic 2 which is depicted in FIG. 1.

The serial-parallel/parallel-serial conversion circuit shown in FIG. 4 is commonly employed by the adjacent memory cell arrays A and B, and these memory cell arrays A and B correspond to, for example, the memory cell arrays 1-1 and 1-5 which are shown in FIG. 1. Additionally, the depiction in FIG. 2 described above was only of the data flow relating to memory cell array B. In memory cell array A and B, data DQ0–7<0> through DQ0–7<3> correspond to, respectively, the 0th bit data through the 3rd bit data shown in FIG. 2. In other words, the reference to "RDQ0–7" or "WDQ07" indicates eight data lines. As is shown in FIG. 2, in these memory cell arrays A and B, the block of DQ0–7<0> corresponding to the 0th data is disposed at the lower side of the figure, that is to say, at the side of the input/output interface circuit which is not depicted in the figure, while the blocks DQ0–7<1>, DQ0–7<2>and DQ0–7<3> are positioned at increasing distances from the input/output interface circuit.

Next, the parallel-serial conversion circuit for converting the parallel data read out from memory cell arrays A and B to serial data will be explained. The parallel-serial conversion circuit comprises multiplexer (referred to in the figures as MUX) groups 20-1 through 20-3 and flip flop groups 21-1 through 21-3. Multiplexer groups 20-0 through 20-3 each comprise eight multiplexers corresponding to data DQ0–7; in accordance with the logic level of a signal inputted to the SLL terminal, one or the other of the signals connected to the A terminal and the B terminal is selected, and outputted to the Q terminal. Here, when the selection signal SELR inputted into the SEL terminal has a "H" level, then the A terminal is selected, while when the signal has a "L" level, the B terminal is selected. In other words, in accordance with the SELR signal, the multiplexer groups 20-0 through 20-3 output to flip flop groups 21-0 through 21-3, in alternating fashion, the data DQ0–7<0> through DQ0–7<3> from the memory cell array A and the data DQ0–7<0> through DQ0–7<3> from memory cell array B.

On the other hand, flip flop groups 21-0 through 21-3 comprise, in the same way as multiplexer groups 20-0 through 20-3, eight flip flops corresponding to data DQ0–7, and as is explained in the text relating to FIG. 2, these comprise eight groups of shift registers. Furthermore, these flip flop groups 21-0 through 21-3 are flip flops with attached load functions, and when the load terminal is at the "L" level, then the data inputted into the D1 terminal are incorporated on the rise of the clock signal RCLK inputted into the CLK terminal, and are outputted from the Q terminal, while when the load terminal is at the "H" level, then the data inputted into the D2 terminal are incorporated on the rise of the clock signal RCLK and are outputted from the Q terminal.

Furthermore, in flip flop groups 21-0 through 21-3, the data outputted from the Q terminals of the multiplexer groups 20-0 through 20-3 are supplied to the D2 terminal, and in addition, a data load signal Load is inputted commonly into the load terminals, and the clock signal RCLK described above, which serves as the data readout clock, is commonly inputted into the CLK terminals. Furthermore, among these flip flop groups, the data outputted from the Q terminals of flip flop groups 21-1 through 21-3 is supplied to the D1 terminals of flip flop groups 21-0 through 21-2, and the D1 terminal of flip flop group 21-3 is connected to the power source. Then, the output of the Q terminal of flip flop group 21-0 is outputted as data RDQ0–7 to the exterior of the device via the interface logic 2 which is depicted in FIG. 1.

As described above, in the parallel-serial conversion circuit, the 32-bit parallel data outputted simultaneously from the memory cell array are incorporated into flip flop groups 21-0 through 21-3, and, while conducting a shifting operation of these one step at a time in the eight shift registers comprising the flip flop groups, data comprising a collection of the 8 bits are outputted serially as data RDQ0–7.

Next, the serial-parallel conversion circuit which serves to convert the inputted serial data into parallel data and write these into memory cell array A and B will be explained. The serial-parallel conversion circuit comprises D flip flop groups 22-0 through 22-3, D latch groups 23-0 through 23-3, and writing amplifier groups 24-0 through 24-3 and 25-0 through 25-3. As was explained under the parallel-serial conversion circuit, to correspond to data DQ0–7, eight of these D flip flop groups 22-0 through 22-3, D latch groups 23-0 through 23-3, and writing amplifier groups 24-0 through 24-3 and 25-0 through 25-3 are provided. D flip flop groups 22-0 through 22-3 comprise D type flip flops which incorporate data inputted into the D terminal when the clock rises in accordance with the clock signal WCLK which is a clock for data writing, and output these from the Q terminal. Among these, the data outputted from the Q terminals of the D flip flop groups 22-1 through 22-3 are supplied to the D terminals of D flip flop groups 22-0 through 22-2, and the data WDQ0–7, which are the data to be written, are inputted into the D terminal of D flip flop group 22-3. These D flip flop groups 22-0 through 22-3 also have a structure with eight groups of shift registers in the same way as the flip flop groups 21-0 through 21-3 described above.

In the parallel-serial conversion circuit, the data readout from the memory cell arrays are sent in order from the flip flop group 21-3 in the direction of the flip flop group 21-0 and the data RDQ0–7 are incorporated as the data readout from the flip flop group which is closest to the to input/output interface circuit. On the other hand, the data WDQ0–7 are supplied to the flip flop group which is at the position farthest removed from the input/output interface circuit in the serial-parallel conversion circuit. The reason for this is that when data are written into the memory cell array, as well, supply commences in order from the 0th bit parallel data, the 0th bit parallel data is first incorporated into D flip flop group 22-3 and this is then successively shifted in the direction of the D flip flop group 22-0, and thereby, the 0th through 3rd bit parallel data are stored in that order in the D flip flop groups 22-0 through 22-3. In other words, FIG. 4 shows a structure in which the data readout (access time) has priority over the data writing.

Next, D latch groups 23-0 through 23-3 incorporate data from the respective D terminals which has been outputted from the Q terminals of the D flip flop groups 22-0 through 22-3, and output these from their own Q terminals, while the latch signal latch which is commonly inputted into the EN terminals has an "H" level. Next, writing amplifier groups 24-0 through 24-3 have a signal WEA which has a "H" level inputted into the EN terminals thereof when data writing is to conducted into the memory cell array A, and when this EN terminal has an "H" level, the output of D latch groups 23-0 through 23-3 is buffered and is outputted to memory cell array A. In the same way, writing amplifier groups 25-0 through 25-3 have inputted into the EN terminals thereof a signal WEB which has a "H" level when writing is to be conducted with respect to the memory cell array B, and when the EN terminal has a "H" level, the output of the D latch groups 23-0 through 23-3 is buffered and is outputted to memory cell array B.

As described above, the serial-parallel conversion circuit incorporates serially inputted data WDQ0–7 into the shift registers comprising flip flop groups 22-0 through 22-3, and while conducting this incorporation, conduct a shift operation in parallel, and when data corresponding to 32 bits have been incorporated into the shift registers, transmits the data stored in the shift registers to the latch groups 23-0 through 23-3 using the latch signal Latch, and simultaneously writes the parallel data in the latch groups into either memory cell array A or B.

In the structure shown in FIG. 4, the direction in which the clock signals RCLK and WCLK are supplied (in the figure, the direction from the bottom to the top) and the direction in which the data are shifted (in the figure, from the top to the bottom) are exactly opposite, so that this structure is optimal for the shift register operation. In other words, from the point of view of the margin of the hold time and the set up time of the data, it is desirable that each shift register stage incorporate the data from the previous stage and supply this incorporated data to the following stage, and then, after this that the data of the previous stage inputted into each shift register stage be altered. At this point, in accordance with the circuit structure shown in the figure, the clock signal is supplied at earlier times as the flip flop groups are positioned at the lower side, and the data of the previous stages is incorporated. On the other hand, the clock signal is supplied at a delayed time as the flip flop groups are disposed at the upper side, and the output data thereof changes, so that it is as described above.

Figure 5:
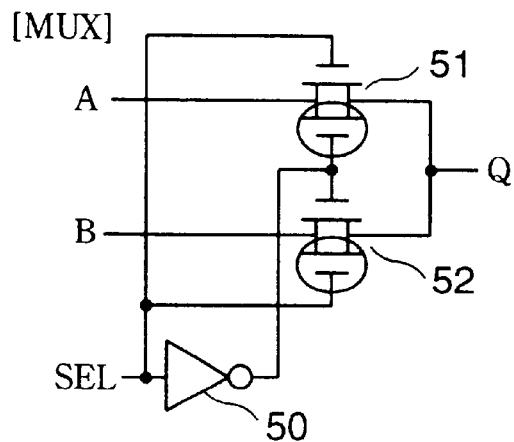
FIG. 5 is a circuit diagram showing an example of the structure of a multiplexer in each embodiment of the present invention.

Here, a concrete circuit structure example will be shown with respect to each part comprising the parallel-serial conversion circuit and the serial-parallel conversion circuit depicted in FIG. 4. FIG. 5 is a structural example of the multiplexer groups 20-0 through 20-3; reference 50 shows an inverter, while references 51 and 52 show transfer gates. These transfer gates are those commonly constructed using a pair containing an n-type MOSFET (metal oxide semiconductor field effect transistor) and a p-type MOSFET indicated by a circle (○); the transfer gates refer to hereinbelow are identical. In the structure depicted, if the SEL terminal has an "H" level, then the A terminal and the Q terminal are connected by the transfer gate 51, while when the SEL terminal has an "L" level, the B terminal and the Q terminal are connected by transfer gate 52.

Figure 6:
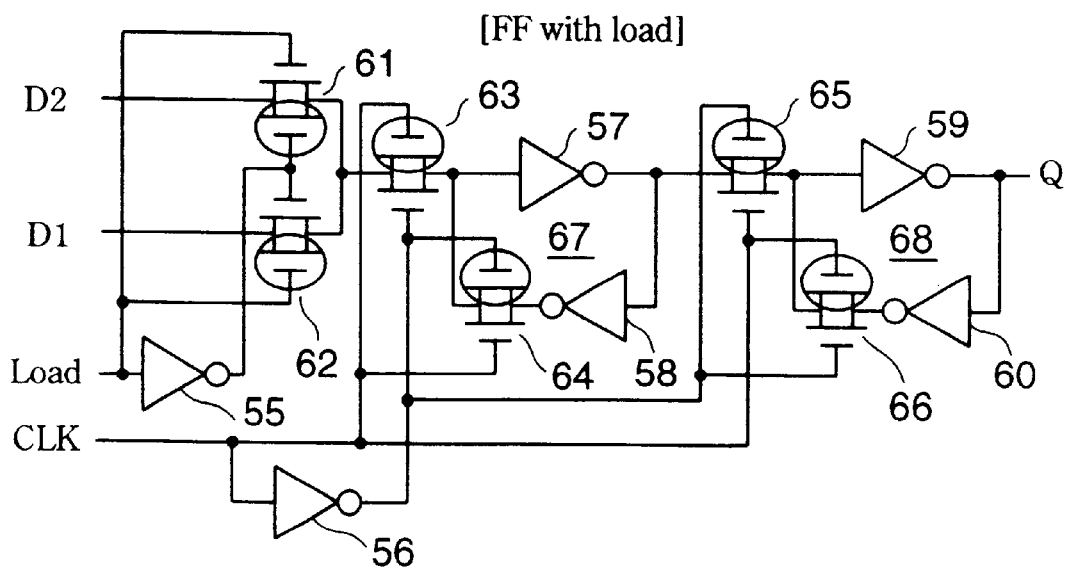
FIG. 6 is a circuit diagram showing an example of a structure of a flip flop with an attached load function in each embodiment of the present invention.

Next, FIG. 6 is a structural example of the flip flop gates 21-0 through 21-3 with detached load functions; references 55 through 60 indicate inverters, while references 61 through 66 indicate transfer gates. Among these, inverters 57 and 58 and transfer gate 64 form a data storage part 67, while inverters 59 and 60 and transfer gate 66 form a data storage part 68. By means of the structure depicted in the figure, when the load terminal has an "H" level, then among the transfer gates 61 and 62, only the former is open, and the data (load data) inputted into the D terminal are transmitted to transfer gate 63. On the other hand, when the load terminal has an "L" level, then only the latter transfer gate 62 is opened, and the data (shift data) inputted into terminal D1 are transmitted to the transfer gate 63.

Furthermore, when the clock inputted into the CLK terminal has a level of "L", the transfer gate 64 closes and the output of inverter 58 is cut off from the input of inverter 57, and by opening transfer gate 63, the data applied to one or the other of terminal D1 and terminal D2 is transmitted to data storage part 67 in accordance with the logic level of the load terminal. Furthermore at this time the transfer gate 65 is closed, so that the data stored in data storage part 67 are prevented from being incorporated into the data storage part 68 side, and the transfer gate 66 is opened and the data storage part 68 stores the data, and the stored data are outputted to the Q terminal. As described above, from the fall of the clock inputted into the CLK terminal until the next rise in the clock, data selected in accordance with the logic level of the load terminal are incorporated into the data storage part.

On the other hand, when the clock inputted into the CLK terminal reaches the "H" level, the transfer gate 63 closes and either the data of the D1 terminal or the D2 terminal is prevented from being transmitted from the data storage part 67, and the transfer gate 64 opens and data storage part 67 continues to store the data incorporated at the point in time at which the clock rose. Furthermore, at this time, the transfer gate 66 closes and the output of inverter 60 is cut off from the input of inverter 59, and by opening transfer gate 65, the data stored in data storage part 67 are transmitted to the data storage part 68 side, so that the data outputted from terminal Q are also changed. In the manner described above, from the rise of the clock to the succeeding fall of the clock, the data incorporated into data storage part 67 at the rise of the clock are transmitted to data storage part 68 and terminal Q.

Figure 7:
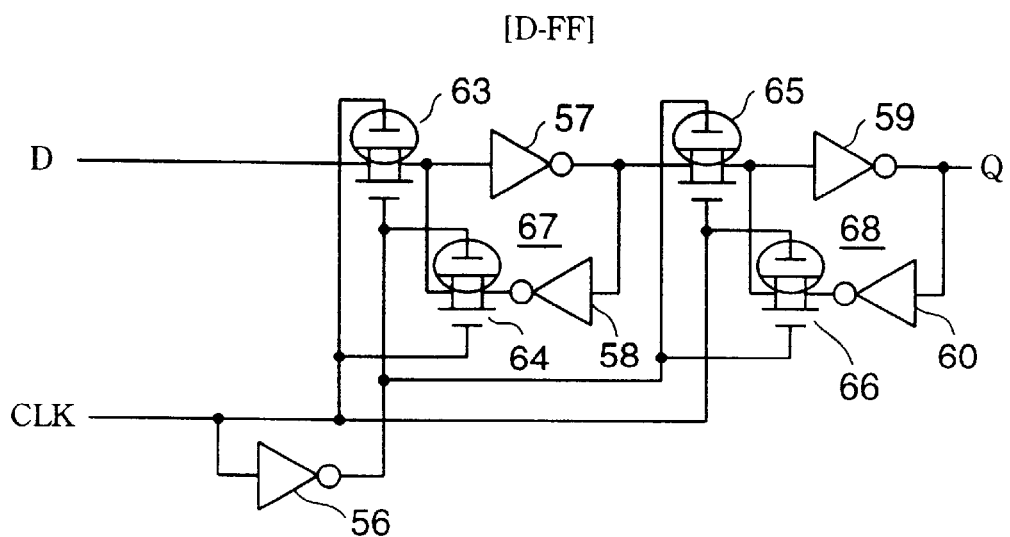
FIG. 7 is a circuit diagram showing an example of the structure of a D flip flop in each embodiment of the present invention.

Next, FIG. 7 is an example of the structure of the D flip flop gates 22-0 through 22-3; those structural elements which are the same as those depicted in FIG. 6 are given identical reference numbers. In the D flip flop shown in FIG. 7, the inverter 55 and the transfer gates 61 and 62 have been eliminated from the structural example of the flip flop with attached load functions shown in FIG. 6, and the D terminal is directly connected to the transfer gate 63. For this reason, whereas in FIG. 6 either the data inputted into the D1 terminal or the data inputted into the D2 terminal was selected and transmitted to the data storage part 67, in the D flip flop shown in FIG. 7, while the clock signal CLK is at the "L"level, the data inputted into the D terminal are transmitted in an unchanged fashion to the data storage part 67, and this is the only point of difference.

Figure 8:
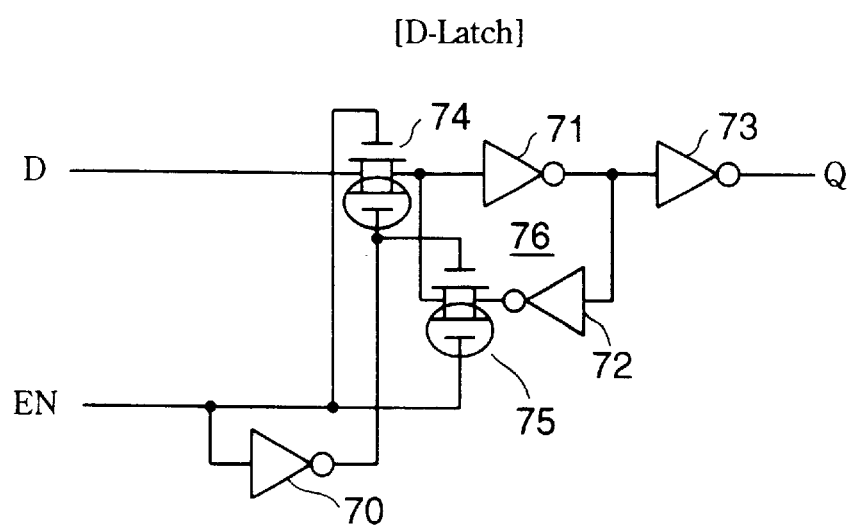
FIG. 8 is a circuit diagram showing an example of the structure of a D latch in each embodiment of the present invention.

Next, FIG. 8 shows a structural example of the D latch groups 23-0 through 23-3; references 70 through 73 indicate inverters, while references 74 through 75 indicate transfer gates. Here, inverters 71 and 72 and transfer gate 75 form data storage part 76. In accordance with the structure depicted in the figure, if the signal inputted into the EN terminal has a level of "H", the transfer gate 74 opens and the data inputted into the D terminal are transmitted to the data storage part 76, so that the data inputted into the D terminal via inverters 71 and 73 are themselves outputted to the Q terminal. Furthermore, at this time, the transfer gate 75 closes and the output of inverter 72 is prevented from being transmitted to the input of inverter 71. On the other hand, when the signal inputted into the EN terminal has the "L" level, the transfer gate 74 closes and the transfer gate 75 opens, so that the data in the data storage part 76 continue to be stored.

Figure 9:
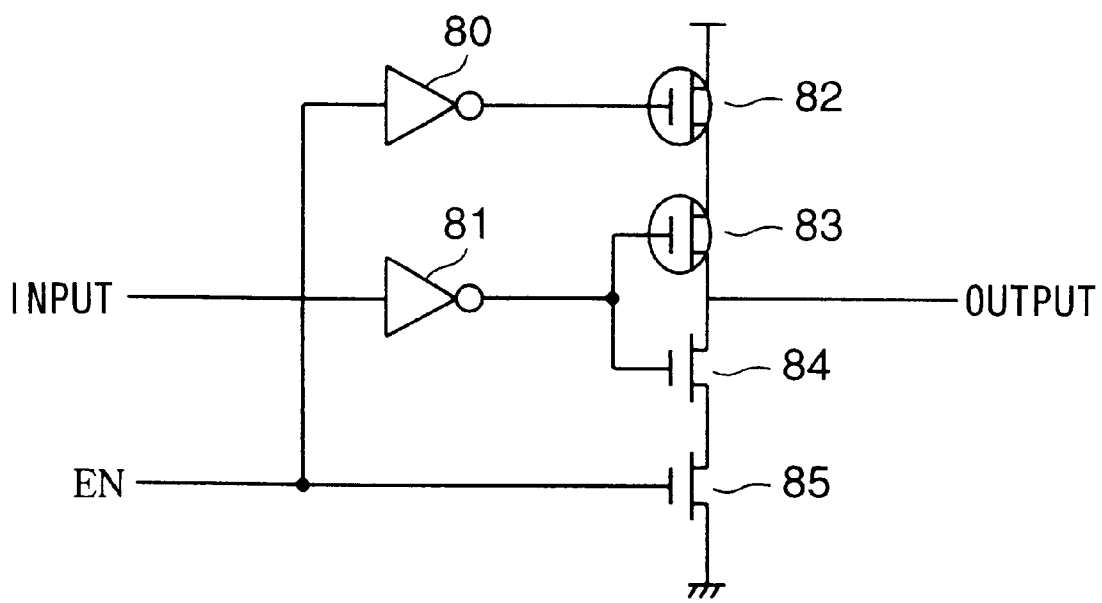
FIG. 9 is a circuit diagram showing an example of the structure of a writing amplifier in each embodiment of the present invention.

Next, FIG. 9 is a structural example of the writing amplifier groups 24-0 through 24-3 and 25-0 through 25-3; references 80–81 indicate inverters, while references 82-83 indicate p-type MOSFETs, and references 84–85 are n-type MOSFETs. In accordance with the structure depicted in the figure, when the signal inputted into the EN terminal has an "H" level, MOSFET 85 enters an ON state and the output of inverter 80 attains the "L" level, so that MOSFET 82 also enters an ON state. For this reason, the "inputted" data are outputted in an unchanged manner as "output". In other words, when the inputted data have an "H" level and the output of inverter 81 has the "L" level, then MOSFET 83 enters an ON state, MOSFET 84 enters an OFF state, and the output is connected to the power source. On the other hand, when the inputted data have an "L," level, then MOSFET 83 enters an OFF state, MOSFET 84 enters an ON state, and the output is connected to the ground. In addition, if the signal inputted into the EN terminal has an "L" level and the output of the inverter 80 has an "H" level, then both MOSFET 82 and 85 enter an OFF state, and the output has a high impedance state irrespective of the inputted data.

Figure 10:
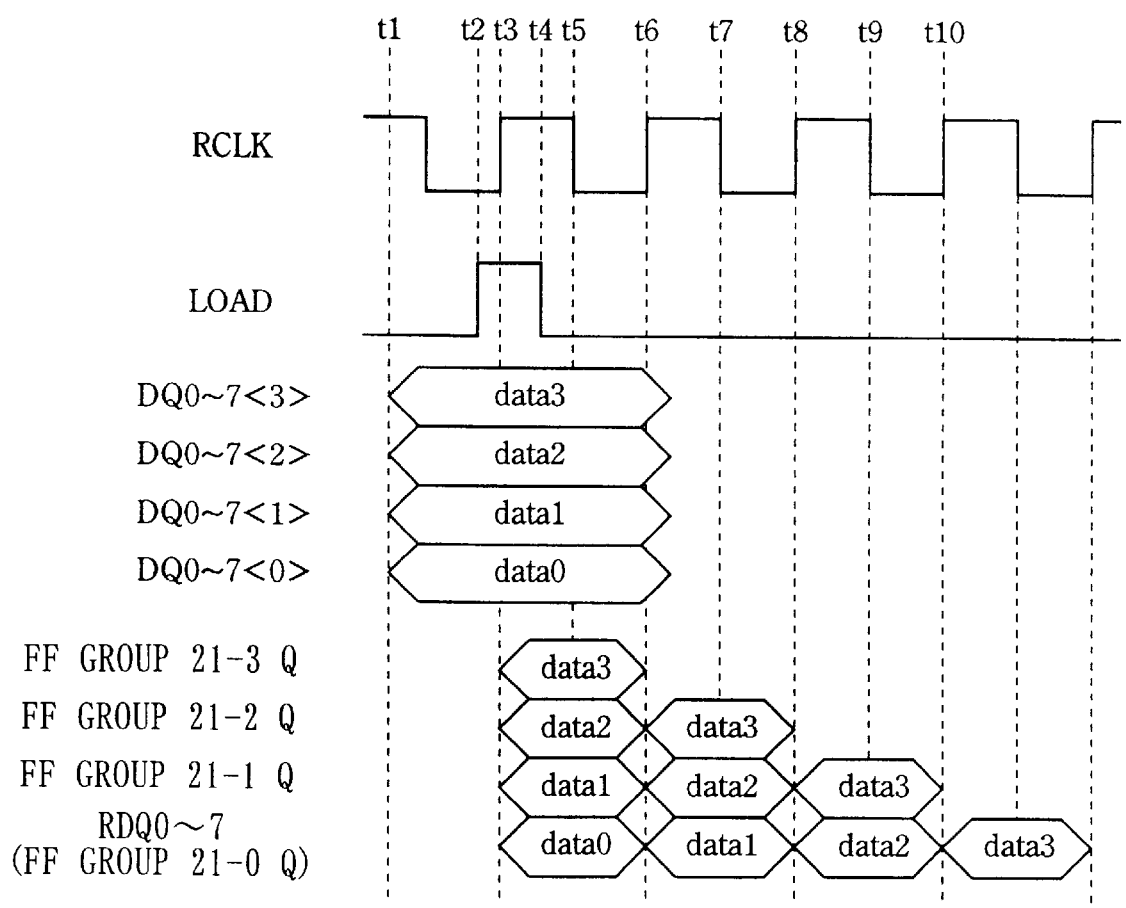
FIG. 10 is a timing chart showing the outlines of the operation in the case in which parallel data is read out from a memory cell array in each embodiment of the present invention.

Next, the operation of the semiconductor memory device having the structure described above will be explained. Here, FIG. 10 is a timing chart showing the outlines of the operation when parallel data are to be read out from the memory cell array. Here, the explanation will be of a case in which data are read out from the memory cell array A in FIG. 4. In this case, readout is conducted from the memory cell array, so that signal WEA, signal WEB, and the latch signal Latch all have a level of "L", and a clock is not inputted into clock signal WCLK.

When the request to activate the bank and row, and the succeeding readout request, are applied together with an address signal designating a specified memory cell group in the memory cell array A, then among the plurality of banks, that specified bank which is designated by the address signal is activated. Furthermore, the word line corresponding to the row in the memory cell array which is designated by the address signal is activated, and the data of the memory cell read out onto the bit line corresponding to the column designated by the address signal is read out via the sense amplifier, a column switch, a data amplifier, and the like. Up to this point, this is the same as in the conventional semiconductor memory device; by means of this series of operations a total of 32 bits of data are readout from the blocks of DQ0–7<0> through DQ0–7<3> which are present in the memory cell array A shown in FIG. 4.

On the other hand, when there is a data readout request with respect to memory cell array A, prior to the actual readout, the signal SELR in FIG. 4 is set in advance to the "H" level. By means of this, multiplexer groups 20-0 through 20-3 select the data DQ0–7<0> through DQ0–7<3> from the memory cell array A, and these are supplied individually to the D2 terminals of flip flop groups 21-0 through 21-3. Next, it will be assumed that the data which are read out from memory cell array A at a time t1 begin to be outputted. The data DQ0–7<0> through DQ0–7<3> read out are the 8-bit data "data 0" through "data 3" in FIG. 10.

Next, when a pulse is inputted into data load signal LOAD and level "H" is attained at time t2, the flip flop groups 21-0 through 21-3 initiate the incorporation of the data "data 0" through "data 3" inputted into the respective D2 terminals. After this, when the clock signal RCLK starts up at time t3, the flip flop groups 21-0 through 21-3 output the data "data 0" through "data 3", which were incorporated from the D2 terminals, from the Q terminals. As a result, the "data 0", which are the 0th bit parallel data, are outputted from the flip flop group 21-0 as data RDQ0–7, and these are outputted to the exterior of the device from the I/O pads corresponding to the data RDQ0–7, via the input/output interface circuit 5-1.

After this, when the data load signal LOAD switches to an "L" level at T4, flip flop groups 21-0 through 21-3 select the D1 terminal side. When the clock circuit RCLK subsequently falls at time t5, flip flop groups 21-0 through 21-3 initiate the incorporation of data inputted into the D1 terminals. That is to say, flip flop groups 21-0 through 21-2 incorporate the data "data 1" through "data 3" which were outputted from flip flop groups 21-1 through 21-3. The D1 terminal of flip flop group 21-3 is connected to the power source, so that a fixed value ("FF" in hexadecimal notation) is incorporated, and this is successively shifted in flip flop groups 21-2 through 22-0, however, an explanation thereof will be omitted here, as it has no direct relationship to the operation of the present embodiment.

Next, when the clock signal RCLK rises at time to, the data "data 1" through "data 3" incorporated by flip flop groups 21-0 through 21-2 are respectively outputted. As a result, in the same way as in the case of the data "data 0", data "data 1" is outputted to the exterior of the device as data RDQ0–7. Thereinafter, in the same manner, flip flop groups 21-0 and 21-1 initiate the incorporation of data "data 2" and "data 3" which are inputted into the D1 terminals at time t7, and output the incorporated data at time t8, so that "data 2" is outputted to the exterior of the device as data RDQ0–7. Next, at time t9, flip flop group 21-0 initiates the incorporation of data "data 3" inputted into the D1 terminal, and at time t10, outputs the incorporated data as data RDQ0–7, and outputs these to the exterior device. In this way, 8-bit X 4-cycle serial data readout is completed.

Next, if the memory cell array A is taken to be the memory cell array 1-1 shown in FIG. 1, the operations described above are conducted in the memory cell array 1-3 and the serial-parallel/parallel-serial conversion circuit 8-3, and ultimately 8-bit X 8-cycle data are readout to the exterior of the device. Furthermore, the same sort of processing is conducted in memory cell arrays 1-2, 1-4, 1-6, and 1-8, as well.

The explanation above centered on data readout from memory cell array A, however, the case in which parallel-serial conversion is conducted with respect to the data read out from the memory cell array B is identical to the case of memory cell array A with the exception of the following points. That is to say, in this case the selection signal SELR is set in advance to the "L" level, and the multiplexer groups 20-0 through 20-3 select, respectively, the data DQ0–7<0> through DQ0–7<3> from the memory cell array and supply these to the D2 terminals of the flip flop groups 21-0 through 21-3. The operations after this point are identical to those in those in the case of memory cell array A.

Figure 11:
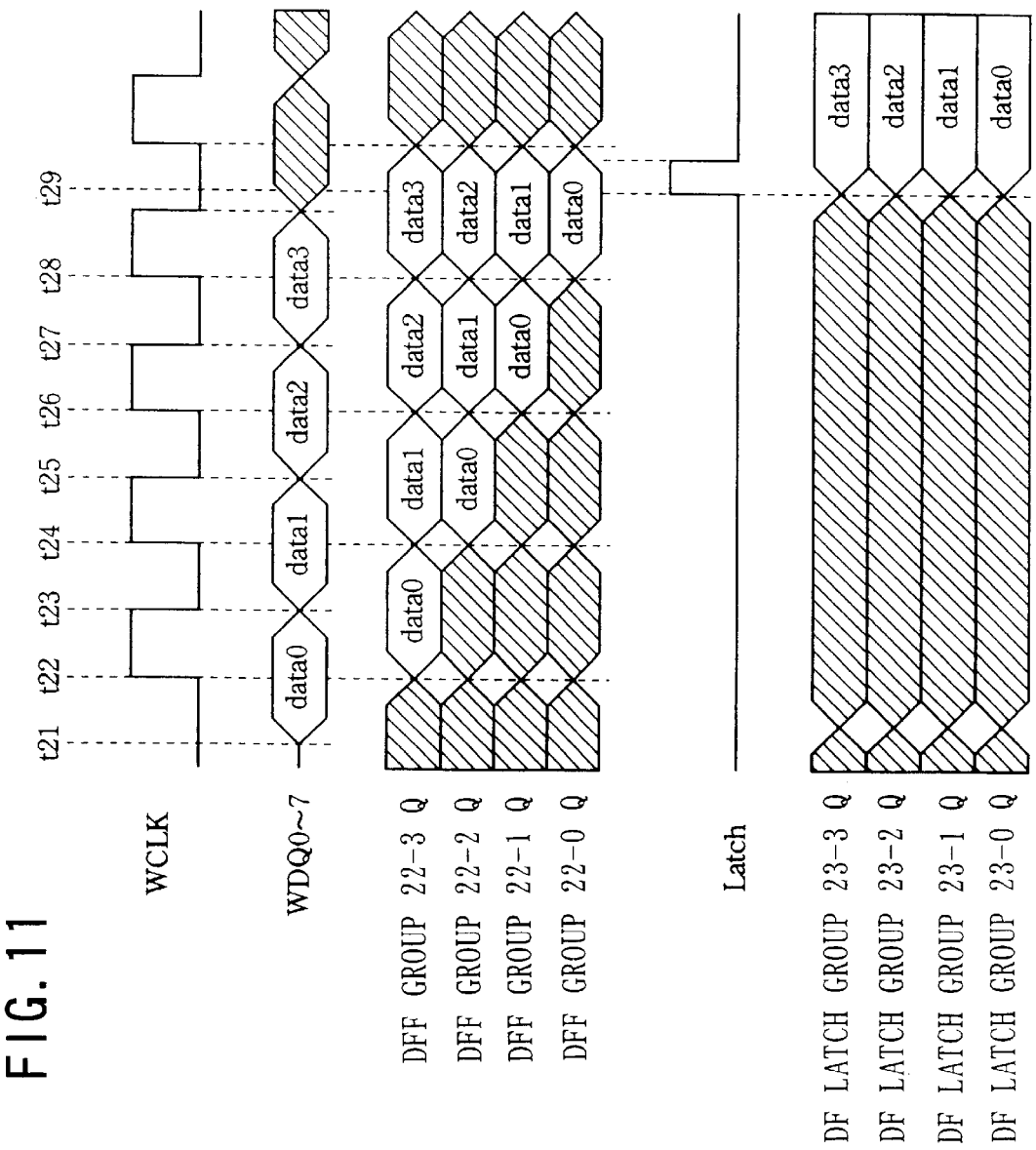
FIG. 11 is a timing chart showing the outlines of the operation in the case in which data is written into a memory cell array in each embodiment of the present invention.

Next, FIG. 11 is a timing chart showing the outlines of the operation in the case of the writing of data with respect to a memory cell array. Here, as well, the explanation will center on the case of writing data to the memory cell array A. In this case, data are written to the memory cell array, so that the data load signal LOAD is at the "L" level and a clock is not inputted into the clock signal RCLK. Furthermore, as in the case of readout, the data "data 0" through "data 3" are written into the blocks DQ0–7<0> through DQ0–7<3> in memory cell array A.

First, in the same way as was explained in the case of the readout above, when a bank and row activation request and the succeeding writing request are applied together with an address signal, the designated bank and word line are activated and a state is established in which writing is possible to the bit line corresponding to the indicated column. Up to this point, this is identical to the case of the conventional semiconductor memory device. Additionally, when there is a writing request with respect to the memory cell array A, the signal WEA is set in advance of the actual writing to the "H" level, while the signal WEB is set to the "L" level. By means of this, the writing amplifier groups 25-0 through 25-3 are placed in a disabled state, and the output thereof is in the high impedance state. On the other hand, the writing amplifier groups 24-0 through 24-3 are placed in an enabled state, so that the state attained is one in which it is possible to conduct output from flip flop groups 23-0 through 23-3 to each block DQ0–7 <0> through DQ0–7<3> of the memory cell array A.

After this, the written data are successively shifted with respect to the semiconductor memory device from the exterior, and when this is done, writing data "data 0" are supplied at time t21 to data WDQ0–7 via the interface logic 2 shown in FIG. 1. These data are inputted into the D terminal of flip flop group 22-3 and data incorporation is initiated. After this, when the clock signal WCLK rises at time t22, as a result of conducting the shift operation in the shift registers, the incorporation of data by flip flop group 22-3 is completed, and data "data 0" are outputted, and these data are inputted into the D terminal of flip flop group 22-2. Next, when t23 is reached, the data in data WDQ0–7 are switched to data "data 1", and when the clock signal WCLK rises at time t24, flip flop group 22-2 incorporates the data "data 0" outputted by the flip flop group 22-3 and outputs these data and these data are also inputted into the D terminal of flip flop group 22- 1. On the other hand, flip flop group 22-3 incorporates data "data 1" in WDQ0–7 and outputs these.

Thereinafter, the same shift operations are conducted. In other words, at time t25, WDQ0–7 switches over to data "data 2" and when the clock signal WCLK rises at time t26, the flip flop group 22-1 incorporates the data "data 0" outputted by the flip flop group 22-2 and outputs these, and these data are inputted into the D terminal of the flip flop group 22-0. Furthermore, flip flop group 22-2 incorporates and outputs the data "data 1" outputted by the flip flop group 22-3, and flip flop group 22-3 incorporates and outputs the data "data 2" inputted from WDQ0–7. Then, at time t27, WDQ0–7 switches over to data "data 3" and when clock signal WCLK rises at time t28, flip flop groups 22-0 through 22-2 output the data "data 0" through "data 2" outputted by, respectively, the flip flop groups 22-1 through 22-3, and flip flop group 22-3 outputs the "data 3" inputted from WDQ0–7.

As described above, synchronously with the clock signal WCLK, the data "data 0" through "data 3" are successively incorporated into flip flop group 22-3, and simultaneously, the shift registers comprising flip flop groups 22-0 through 22-3 carry out a shift operation. As a result, at time t28, all data corresponding to 8-bits×4-cycles are incorporated into flip flop groups 22-0 through 22-3. After this, when a pulse is inputted into the latch signal Latch at time t29, and this signal reaches the "H" level, then data latch groups 23-0 through 23-3 incorporate the data "data 0" through "data 3" outputted by the flip flop groups 22-0 through 22-3, and output these from the Q terminals. As a result, these data are written into each block DQ0–7<0> through DQ0–7<3> of memory cell array A via the writing amplifier groups 24-0 through 24-3.

The foregoing explanation centered on the writing of data into the memory cell array A; however, the serial-parallel conversion conducted when writing data into memory cell array B is identical to that in the case of the memory cell array A with the exception of the following points. That is to say, in this case, prior to the actual writing, the signal WEA is set to a "L" level, and the signal WEB is set to an "H" level, and, as a result, the writing amplifier groups 24-0 through 24-3 enter a disabled state and the output thereof enters a high impedance state, and furthermore, the writing amplifier groups 25-0 through 25-3 enter an enabled state. For this reason, by means of operations similar to those explained in the case of the memory cell array A, data "data 0" through "data 3" are all incorporated into the D latch groups 22-0 through 22-3 and are then written into each block DQ0–7<0> through DQ0–7<3> of the memory cell array B via writing amplifier groups 25-0 through 25-3.

Second Embodiment

Figure 12:
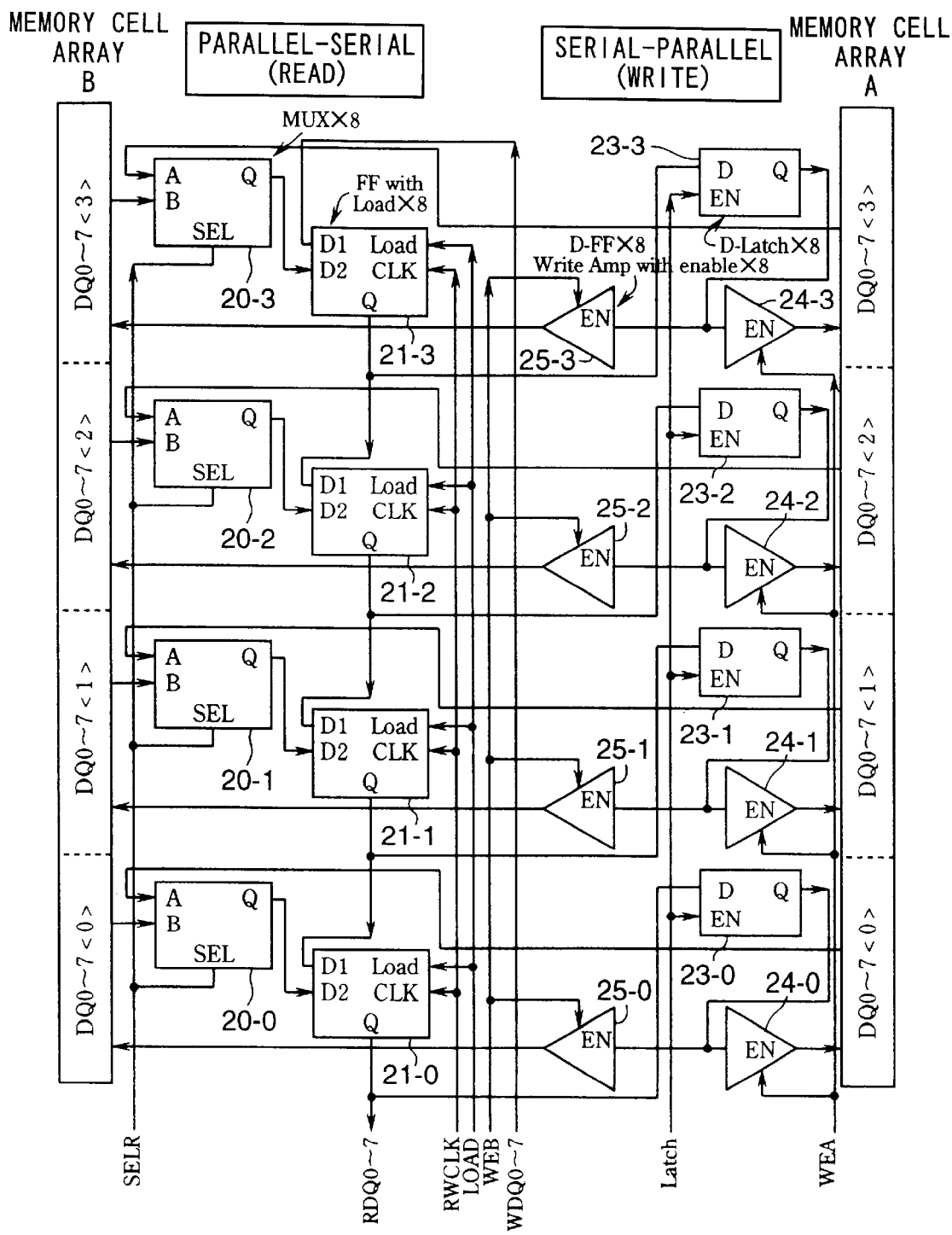
FIG. 12 is a block diagram showing the details of the structure of a serial-parallel/parallel-serial conversion circuit in accordance with the second embodiment of the present invention.

As described above, in the present embodiment, the serial-parallel conversion circuit and the parallel-serial conversion circuit use a portion of the circuitry in common; however, the function itself is identical to that in the first embodiment, and the function explained with reference to FIGS. 1, 2, 10, and 11 is completely identical to that of the first embodiment. The present embodiment differs from that in the first embodiment only in the structure of the details of the serial-parallel/parallel-serial conversion circuit and the function thereof. FIG. 12 shows the details of the structure of a serial-parallel/parallel-serial conversion circuit in accordance with the present embodiment; those structural elements which are identical to those shown in FIG. 4 are given identical reference numbers.

In the present embodiment, the D flip flop groups 22-0 through 22-3 present in FIG. 4 are omitted, and the function of these groups is realized using the flip flop groups 21-0 through 21-3. For this reason, whereas the D1 terminal of flip flop group 21-3 in FIG. 4 was connected to the power source, in the present embodiment, this is connected to the WDQ0–7 which input the writing data. Furthermore, in concert with the elimination of the D flip flop groups 22-0 through 22-3, the Q terminal output of the flip flop groups 21-0 through 21-3 is connected to the D terminals of the D latch groups 23-0 through 23-3. Additionally, the clocks inputted by the clock signals RCLK and WCLK in FIG. 4 are both applied by the clock signal RWCLK shown in FIG. 10. Because the reading operation and the writing operation with respect to a memory cell array are not conducted completely simultaneously, the shift registers which constitute the parallel-serial conversion circuit and the shift registers which constitute the serial-parallel conversion circuit may be commonly employed, and the parallel-serial conversion operation and the serial-parallel conversion operation may be conducted in a time-divided manner.

Next, the points of difference between the present embodiment and the first embodiment with respect to the operation of the semiconductor memory device having the structure described above will be explained. Initially, the parallel-series conversion process with respect to parallel data read out from the memory cell array was explained with reference to FIG. 10; however, the operation in this case is identical to that of the First embodiment. In other words, if the case of readout from memory cell array A is assumed as in the first embodiment, then the data DQ0–7<0> through DQ0–7<3>outputted simultaneously from memory cell array A at time t1 are selected when the data load signal LOAD rises at time t2. After this, at time t3, when the clock signal RWCLK (corresponding to the RCLK in FIG. 10) rises, the selected data "data 0" through "data 3" are loaded into, respectively, flip flop groups 21-1 through 21-3 and as a result, the data "data 0" are obtained as the data RDQ0–7. After this, a shift operation is conducted synchronously with the rise of the clock RWCLK, and at times to, t8, and t10, respectively, the data "data 1", "data 2" and "data 3" are obtained as data RDQ0–7.

Next, the serial-parallel conversion operation conducted when writing is carried out with respect to the memory cell array will be explained with reference to FIG. 11 described above. In this figure, it is necessary to substitute flip flop groups 21-0 through 21-3 for the D flip flop groups 22-0 through 22-3. Here, as well, the case will be assumed in which data are written with respect to the memory cell array A, in the same way as in the first embodiment. First, when data are to be written into the memory cell array, the data load signal LOAD maintains the "L" level, so that flip flop groups 21-0 through 21-3 select the D1 terminal side among the D1 terminal and the D2 terminal. Then, when the data "data 0" are applied as WDQ0–7 at time t21, flip flop group 21-3 initiates the incorporation of this data, and subsequently, when clock signal RWCLK (corresponding to the WCLK in FIG. 11) rises at time t22 and a shift operation is conducted, the flip flop group 21-3 incorporates this data and supplies it to the D1 terminal of flip flop group 21-2. Next, at t23, data "data 1" are applied to WDQ0–7, and when the shift operation is carried out at time t24, flip flop groups 21-2 and 21-3 output, respectively, the data "data 0" and "data 1".

Thereinafter, in the same manner, data "data 2" are applied to WDQ0–7 at time t25, while time t26, flip flop groups 21-1 through 21-3 output, respectively, data "data 0" through "data 2" as the results of the shift operations. Next, at time t27, data "data 3" are applied to WDQ0–7, and at time t28, flip flop groups 21-0 through 21-3 output, respectively, data "data 0" through "data 3" as the results of the shift operation. In this way, when the serially inputted data corresponding to 4 cycles of 8 bits are arranged in flip flop groups 21-0 through 21-3, the latch signal Latch reaches an "H" level at time t29, and the data stored in flip flop groups 21-0 through 21-3 are transmitted to, respectively. D latch groups 23-0 through 23-3. As a result, the 32 bit data transmitted to these D latch groups is written into each block DQ0–7<0> through DQ0–7<3> in the memory cell array A via writing amplifier groups 24-0 through 24-3.

As described above, in the present embodiment, a portion of the serial-parallel conversion circuit and the parallel-serial conversion circuit are commonly employed, so that, in comparison with the first embodiment (FIG. 4) it is possible to eliminate as many as 32 D flip flops for each serial-parallel/parallel-serial conversion circuit. For this reason the scale of the serial-parallel/parallel-serial conversion circuit becomes smaller and it is possible to achieve a further reduction in the chip surface area and savings in power consumption with respect to the first embodiment.

In the embodiment described above, the memory cell arrays A and B disposed on either side of the serial-parallel/parallel-serial conversion circuits had a structure in which the output would be the 0th through the 3rd bit data; however, a structure is also possible in which the memory cell array A outputs the 0th through 3rd bit data while the memory cell array B outputs the 4th through the 7th bit data. Of course, when such a structure is employed, both the memory cell arrays A and B may be activated, so that in consideration of the power consumption required for this, it is preferable that a structure be adopted in which, as in the first and second embodiments described above, at certain points in time only one of the memory cell arrays is activated.

As described in detail above, in each embodiment of the present invention, all I/O (DQ0–DQ7) are disposed in a concentrated manner such that the flip flop group for storing the 0th bit data which are to be initially outputted is at the closest position to the I/O pads. For this reason, it is possible to output the critical 0th bit data, which has the greatest effect on the access time, with the minimum possible delay. Furthermore, the disposition and wiring are conducted so as to concentrate the flip flop groups and signal lines of all I/Os, and these stratagems avoid variation in the wiring length of each I/O. For this reason, the difference in wiring delay among I/Os is eliminated and it is possible to greatly reduce the variation in the timing and to keep the I/O skew difference to a minimum level. Concretely, it is possible to achieve an improvement of approximately 0.2–0.3 ns in the operating margin.

Furthermore, all the signals, such as the clock signal, data load signal, latch signal and the like, which are used to operate the serial-parallel/parallel-serial conversion circuitry run in the same direction, from a point close to the I/O pads (the vicinity of the center of the chip) toward areas farther from the pads (the periphery of the chip). For this reason, if for example, the arrival of the clock signal is delayed, the arrival of the data load signal will also be delayed in the same way, and it is thus possible to avoid a worsening of the margin as a result of the skew discrepancy between the clock signal and the data load signal. Concretely, the skew difference between the clock signal and the data load signal can be kept to 0.1 ns or less. Furthermore, the clock signal and the data load signal may, for example, be made to run in the same direction, and it is thus possible to easily conduct the wiring of the control signals, and to guide this wiring.

Furthermore, the serial-parallel/parallel-serial conversion circuitry is structured so as to be commonly employed by the neighboring left and right memory cell arrays. For this reason, the number of serial-parallel/parallel-serial conversion circuits can be reduced by half in comparison with the conventional structure, and it is possible to reduce the number of elements and the chip surface area by this amount, and it is also possible to reduce the power consumption by the amount necessary for the eliminated serial-parallel/parallel-serial conversion circuits.

What is claimed is:

1. A semiconductor memory device having a plurality of input/output pads for receiving and outputting serial data, said memory device comprising:

a plurality of memory cell arrays which store and transfer data in a parallel format;

at least one serial-to-parallel converter/parallel-to-serial converter combination, wherein said serial-to-parallel converter converts said serial input data into said parallel format for transfer internal to said memory device and said parallel-to-serial converter converts said internal parallel data into serial format as output data from said memory device, and a temporary storage unit integral to each said serial-to-parallel converter/parallel-to-serial converter combination, said temporary storage unit comprising a plurality of flipflops to store data in parallel format, wherein each said serial-to-parallel converter/parallel-to-serial converter combination and integral temporary storage unit serve at least two said memory cell arrays that are adjacent, and wherein said plurality of flipflops in said temporary storage unit are disposed in position such that said flipflops storing data which are initially outputted to the exterior are positioned in closest proximity to said input/output pads.

2. A semiconductor memory device in accordance with claim 1, wherein those of said flipflops storing data simultaneously exchanged with the exterior are disposed together with respect to all said input/output pads.

3. A semiconductor memory device in accordance with claim 1, wherein a control signal for controlling conversion operations by said serial-to-parallel converter/parallel-to-serial converter is supplied from a side of those said flipflops disposed in closest proximity to said input/output pads.

4. A semiconductor memory device in accordance with claim 1, wherein said serial-to-parallel converter/parallel-to-serial converter conducts conversion between said parallel data and said serial data by shifting data stored in said plurality of flipflops in accordance with a clock signal having a predetermined frequency, and a direction in which said clock signal is supplied in order to said flipflops is opposite to a direction in which data stored in said flipflops are shifted.

5. A semiconductor memory device in accordance with claim 1, wherein said serial-to-parallel converter/parallel-to-serial converter is provided with a signal for selecting a memory cell array from among said adjacent memory cell arrays to conduct exchange of said parallel data.

6. A semiconductor memory device in accordance with claim 1, wherein said plurality of flipflops comprise shift registers.

7. A semiconductor memory device in accordance with claim 1, wherein said plurality of flipflops comprise a first shift means, which shifts said parallel data read out from said memory arrays and outputs said serial data in succession, and a second shift means, which conducts shifting, while successively incorporating said serial data supplied through said input/output pads and converts these to said parallel data; and said first shift means and said second shift means are disposed so that a shift direction of said first shift means and a shift direction of said second shift means are identical.

8. A semiconductor memory device in accordance with claim 7, wherein said first shift means and said second shift means comprise identical shift registers, and wherein the conversion operation from said parallel data to said serial data and the conversion operation from said serial data to said parallel data are conducted in a time-divided fashion.

9. A semiconductor memory device according to claim 1, wherein said input/output pads are disposed in such a manner as to be gathered at a central portion of a package and wherein said semiconductor memory device is sealed.

* * * * *